US011968908B2

(12) United States Patent
Peng et al.

(10) Patent No.: US 11,968,908 B2
(45) Date of Patent: Apr. 23, 2024

(54) MAGNETIC TUNNEL JUNCTION DEVICE

(71) Applicant: Taiwan Semiconductor Manufacturing Company, Ltd., Hsinchu (TW)

(72) Inventors: Tai-Yen Peng, Hsinchu (TW); Hui-Hsien Wei, Taoyuan (TW); Han-Ting Lin, Hsinchu (TW); Sin-Yi Yang, Taichung (TW); Yu-Shu Chen, Hsinchu (TW); An-Shen Chang, Jubei (TW); Qiang Fu, Hsinchu (TW); Chen-Jung Wang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/854,289

(22) Filed: Jun. 30, 2022

(65) Prior Publication Data

US 2022/0336727 A1 Oct. 20, 2022

Related U.S. Application Data

(62) Division of application No. 16/746,158, filed on Jan. 17, 2020, now Pat. No. 11,387,406.

(51) Int. Cl.
*H10N 50/80* (2023.01)
*G11C 11/16* (2006.01)
(Continued)

(52) U.S. Cl.
CPC ........... *H10N 50/80* (2023.02); *G11C 11/161* (2013.01); *H10B 61/20* (2023.02); *H10N 50/01* (2023.02);
(Continued)

(58) Field of Classification Search
CPC ........ H10N 50/80; H10N 50/01; H10B 61/20; G11C 11/161
(Continued)

(56) References Cited

U.S. PATENT DOCUMENTS 7,239,543 B2    7/2007  Chung et al.
10,510,802 B2 * 12/2019  Chuang ............... H01L 23/5226
(Continued)

FOREIGN PATENT DOCUMENTS

DE      102019126464 A1    6/2020
KR      20180064828 A      6/2018
(Continued)

*Primary Examiner* — Jami Valentine Miller
(74) *Attorney, Agent, or Firm* — Slater Matsil, LLP

(57) ABSTRACT

In an embodiment, a method includes: forming a first inter-metal dielectric (IMD) layer over a semiconductor substrate; forming a bottom electrode layer over the first IMD layer; forming a magnetic tunnel junction (MTJ) film stack over the bottom electrode layer; forming a first top electrode layer over the MTJ film stack; forming a protective mask covering a first region of the first top electrode layer, a second region of the first top electrode layer being uncovered by the protective mask; forming a second top electrode layer over the protective mask and the first top electrode layer; and patterning the second top electrode layer, the first top electrode layer, the MTJ film stack, the bottom electrode layer, and the first IMD layer with an ion beam etching (IBE) process to form a MRAM cell, where the protective mask is etched during the IBE process.

20 Claims, 23 Drawing Sheets

(51) Int. Cl.
  *H10B 61/00* (2023.01)
  *H10N 50/01* (2023.01)
  *H10N 50/85* (2023.01)

(52) U.S. Cl.
  CPC ....... *G11C 11/1655* (2013.01); *G11C 11/1657* (2013.01); *H10N 50/85* (2023.02)

(58) Field of Classification Search
  USPC .......................................................... 257/421
  See application file for complete search history.

(56) References Cited

U.S. PATENT DOCUMENTS

| | | | |
|---|---|---|---|
| 10,559,744 B2 | 2/2020 | Maertz et al. | |
| 2008/0090307 A1* | 4/2008 | Xiao | H10N 50/10 |
| | | | 438/3 |
| 2010/0065935 A1* | 3/2010 | Horng | G11C 11/1675 |
| | | | 257/E29.323 |
| 2012/0028373 A1* | 2/2012 | Belen | H10N 50/01 |
| | | | 428/411.1 |
| 2013/0240963 A1* | 9/2013 | Beach | H10B 61/22 |
| | | | 257/295 |
| 2014/0063895 A1* | 3/2014 | Li | G11C 17/16 |
| | | | 365/97 |
| 2018/0158867 A1 | 6/2018 | Kim et al. | |
| 2018/0342669 A1 | 11/2018 | Kim et al. | |
| 2020/0006639 A1 | 1/2020 | Wu et al. | |
| 2020/0028072 A1* | 1/2020 | Chuang | H10N 50/10 |
| 2020/0176041 A1* | 6/2020 | Shen | G11C 11/161 |
| 2020/0343299 A1* | 10/2020 | Hsu | H10N 50/10 |
| 2020/0395386 A1 | 12/2020 | Lilak et al. | |
| 2021/0057639 A1* | 2/2021 | Ku | H10B 61/22 |
| 2021/0098693 A1* | 4/2021 | Chuang | H10N 50/01 |
| 2022/0115583 A1* | 4/2022 | Wang | H10B 61/00 |
| 2023/0402078 A1* | 12/2023 | van der Straten | H10N 50/80 |

FOREIGN PATENT DOCUMENTS

| | | |
|---|---|---|
| KR | 20180129303 A | 12/2018 |
| KR | 20200001556 A | 1/2020 |
| TW | 200737186 A | 10/2007 |
| TW | 201803164 A | 1/2018 |
| TW | 201944565 A | 11/2019 |
| TW | 202002343 A | 1/2020 |

* cited by examiner

MAGNETIC TUNNEL JUNCTION DEVICE

PRIORITY CLAIM AND CROSS-REFERENCE

This application is a division of U.S. patent application Ser. No. 16/746,158, filed on Jan. 17, 2020, entitled "Method of Forming Magnetic Tunnel Junction Device Using Protective Mask," which application is hereby incorporated herein by reference.

BACKGROUND

Semiconductor memories are used in integrated circuits for electronic applications, including radios, televisions, cell phones, and personal computing devices, as examples. One type of semiconductor memory is magnetoresistive random access memory (MRAM), which involves spin electronics that combines semiconductor technology and magnetic materials and devices. The spins of electrons, through their magnetic moments, are used to indicate bit values. A MRAM cell typically includes a magnetic tunnel junction (MTJ) stack, which includes two ferromagnets separated by a thin insulator.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
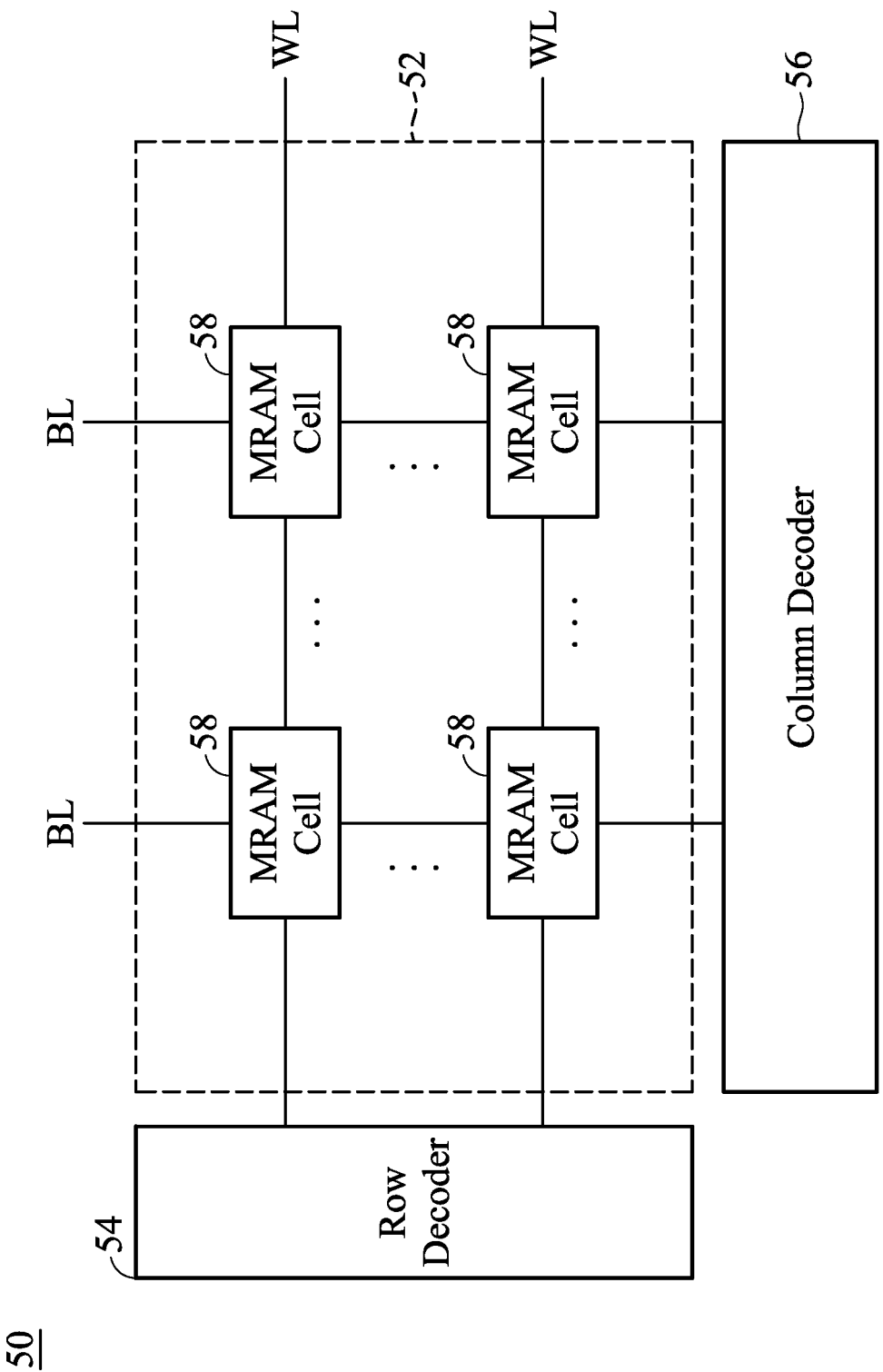
FIG. 1 is a block diagram of a semiconductor device, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, an interconnect structure for an integrated circuit is formed, and MTJ stacks are formed in memory regions of the interconnect structure. The MTJ stacks are used to form MRAM cells in the interconnect structure. During formation of the MTJ stacks, a protective mask is formed over logic regions of the interconnect structure. The MTJ stacks are patterned using the protective mask, e.g., patterning of the MTJ stacks is performed while the protective mask covers the logic regions. Use of the protective mask helps prevent over-etching of dielectric features when forming the MTJ stacks, thus preventing damage to underlying conductive features of the interconnect structure.

FIG. 1 is a block diagram of a semiconductor device 50, in accordance with some embodiments. The semiconductor device 50 includes a MRAM array 52, a row decoder 54, and a column decoder 56. The MRAM array 52 includes MRAM cells 58 arranged in rows and columns. The row decoder 54 may be, e.g., a static CMOS decoder, a pseudo-NMOS decoder, or the like. During operation, the row decoder 54 selects desired MRAM cells 58 in a row of the MRAM array 52 by activating the respective word line WL for the row. The column decoder 56 may be, e.g., a static CMOS decoder, a pseudo-NMOS decoder, or the like, and may include writer drivers, sense amplifiers, combinations thereof, or the like. During operation, the column decoder 56 selects bit lines BL for the desired MRAM cells 58 from columns of the MRAM array 52 in the selected row, and reads data from or writes data to the selected MRAM cells 58 with the bit lines BL.

Figure 2:
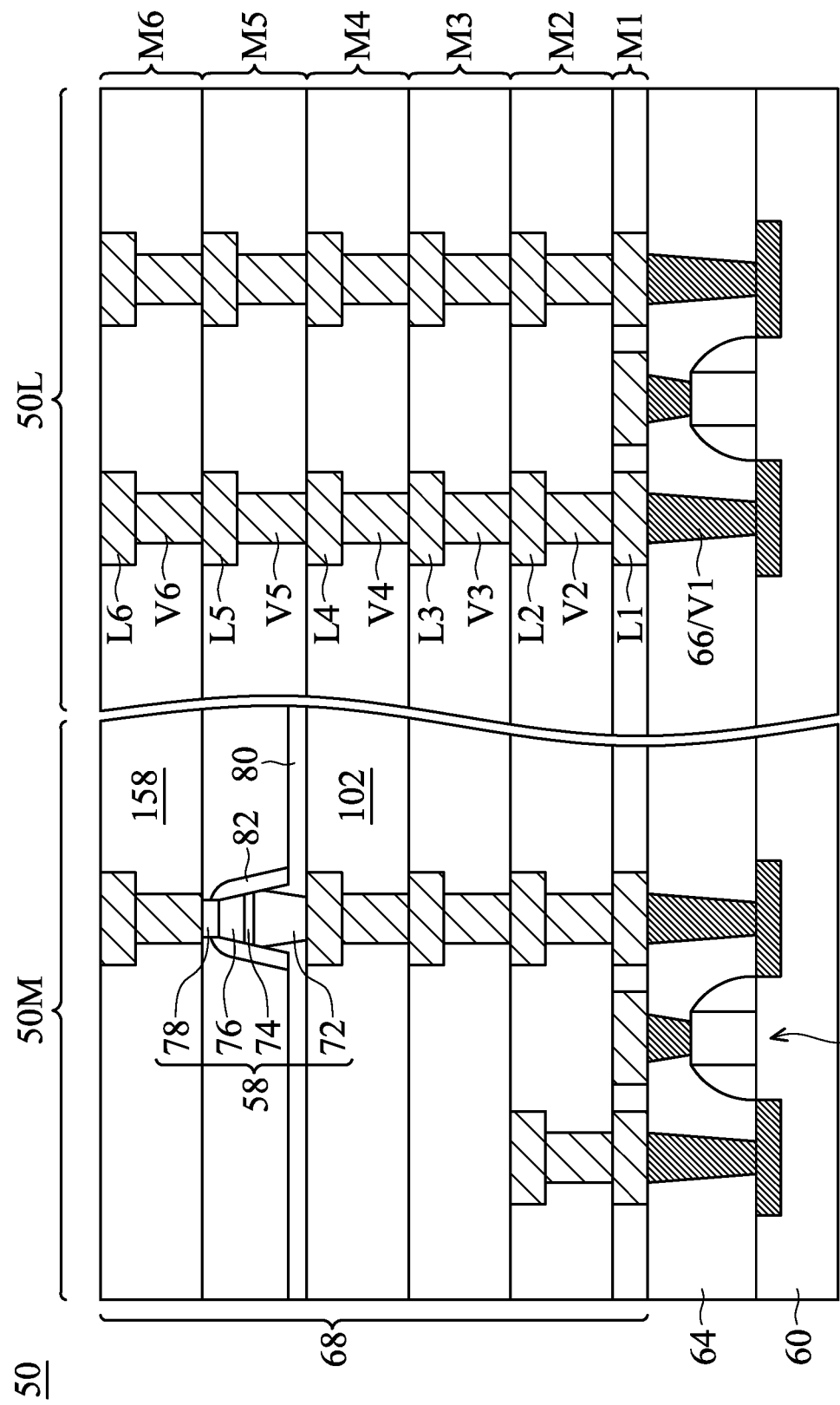
FIG. 2 is a cross-sectional view of a semiconductor device, in accordance with some embodiments.

FIG. 2 is a cross-sectional view of the semiconductor device 50, in accordance with some embodiments. FIG. 2 is a simplified view, and some features (discussed below) are omitted for clarity of illustration. The semiconductor device 50 includes a logic region 50L and a memory region 50M. Memory devices (e.g., MRAMs) are formed in the memory region 50M and logic devices (e.g., logic circuits) are formed in the logic region 50L. For example, the MRAM array 52 (see FIG. 1) can be formed in the memory region 50M, and the row decoder 54 and column decoder 56 (see FIG. 1) can be formed in the logic region 50L. The logic region 50L may occupy most of the area of the semiconductor device 50. For example, the logic region 50L may occupy from 95% to 99% of the area of the semiconductor device 50, with the memory region 50M occupying the remaining area of the semiconductor device 50. The memory region 50M can be disposed at an edge of the logic region 50L, or the logic region 50L can surround the memory region 50M.

The logic region 50L and memory region 50M are formed over a same semiconductor substrate 60. The semiconductor substrate 60 may be silicon, doped or undoped, or an active layer of a semiconductor-on-insulator (SOI) substrate. The semiconductor substrate 60 may include other semiconductor materials, such as germanium; a compound semiconductor including silicon carbide, gallium arsenic, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multilayered or gradient substrates, may also be used.

Devices 62 are formed at the active surface of the semiconductor substrate 60. The devices 62 may be active devices or passive devices. For example, the devices 62 may be transistors, diodes, capacitors, resistors, or the like, formed by any suitable formation method. The devices 62 are interconnected to form the memory devices and logic devices of the semiconductor device 50. For example, some of the devices 62 may be access transistors.

One or more inter-layer dielectric (ILD) layer(s) 64 are formed on the semiconductor substrate 60, and electrically conductive features, such as contact plugs 66, are formed electrically connected to the devices 62. The ILD layer(s) 64 may be formed of any suitable dielectric material, for example, a nitride such as silicon nitride; an oxide such as silicon oxide, phosphosilicate glass (PSG), borosilicate glass (BSG), boron-doped phosphosilicate glass (BPSG), or the like; or the like. The ILD layer(s) may be formed by any acceptable deposition process, such as spin coating, physical vapor deposition (PVD), chemical vapor deposition (CVD), the like, or a combination thereof. The electrically conductive features in the ILD layer(s) may be formed through any suitable process, such as deposition, damascene (e.g., single damascene, dual damascene, etc.), the like, or combinations thereof.

An interconnect structure 68 is formed over the semiconductor substrate 60. The interconnect structure 68 interconnects the devices 62 to form integrated circuits in each of the logic region 50L and memory region 50M. The interconnect structure 68 includes multiple metallization layers M1-M6. Although six metallization layers are illustrated, it should be appreciated that more or less metallization layers may be included. Each of the metallization layers M1-M6 includes metallization patterns in dielectric layers. The metallization patterns are electrically coupled to the devices 62 of the semiconductor substrate 60, and include, respectively, metal lines L1-L6 and vias V1-V6 formed in one or more intermetal dielectric (IMD) layers. The interconnect structure 68 may formed by a damascene process, such as a single damascene process, a dual damascene process, or the like. In some embodiments, the contact plugs 66 are also part of the metallization patterns, such as part of the lowest layer of metal vias V1. FIG. 2 is also labeled with some reference numerals that will be described further below.

The MRAM cells 58 are formed in the interconnect structure 68. The MRAM cells 58 can be formed in any of the metallization layers M1-M6, and are illustrated as being formed in an intermediate metallization layer M5. Each MRAM cell 58 includes a conductive via 72, a bottom electrode 74 on the conductive via 72, a MTJ stack 76 on the bottom electrode 74, and a top electrode 78 on the MTJ stack 76. An additional IMD layer 80 can be formed around the MRAM cells 58, with the conductive via 72 extending through the IMD layer 80. Spacers 82 can also be formed around the MRAM cells 58. The IMD layer 80 and/or spacers 82 surround and protect the components of the MRAM cells 58. The resistance of an MTJ stack 76 is programmable, and can be changed between a high resistance ($R_{ap}$), which can signify a value such as a "1," and a low resistance ($R_p$), which can signify a value such as a "0." As such, a value can be written to an MRAM cell 58 by programming the resistance of its MTJ stack 76 with its corresponding access transistor, and the value can be read from the MRAM cell 58 by measuring the resistance of the MTJ stack 76 with the access transistor.

The MRAM cells 58 are electrically connected to the devices 62. The conductive via 72 is physically and electrically coupled to an underlying metallization pattern, such as to the metal lines L4 in the illustrated example. The top electrode 78 is physically and electrically coupled to an overlying metallization pattern, such as to the metal vias V6 in the illustrated example. The MRAM cells 58 are arranged in a MRAM array having rows and columns of memory. The metallization patterns include access lines (e.g., word lines and bit lines) for the MRAM array. For example, the underlying metallization patterns can include word lines disposed along the rows of the MRAM array and the overlying metallization patterns can include bit lines disposed along the columns of the MRAM array.

FIGS. 3 through 20 are various views of intermediate stages in the manufacturing of an interconnect structure for the semiconductor device 50, in accordance with some embodiments. The interconnect structure includes a MRAM array of MRAM cells. As discussed further below, a protective mask is formed over the logic region 50L during processing of the memory region 50M, which can help protect the logic region 50L from over-etching damage during processing.

Figure 3:
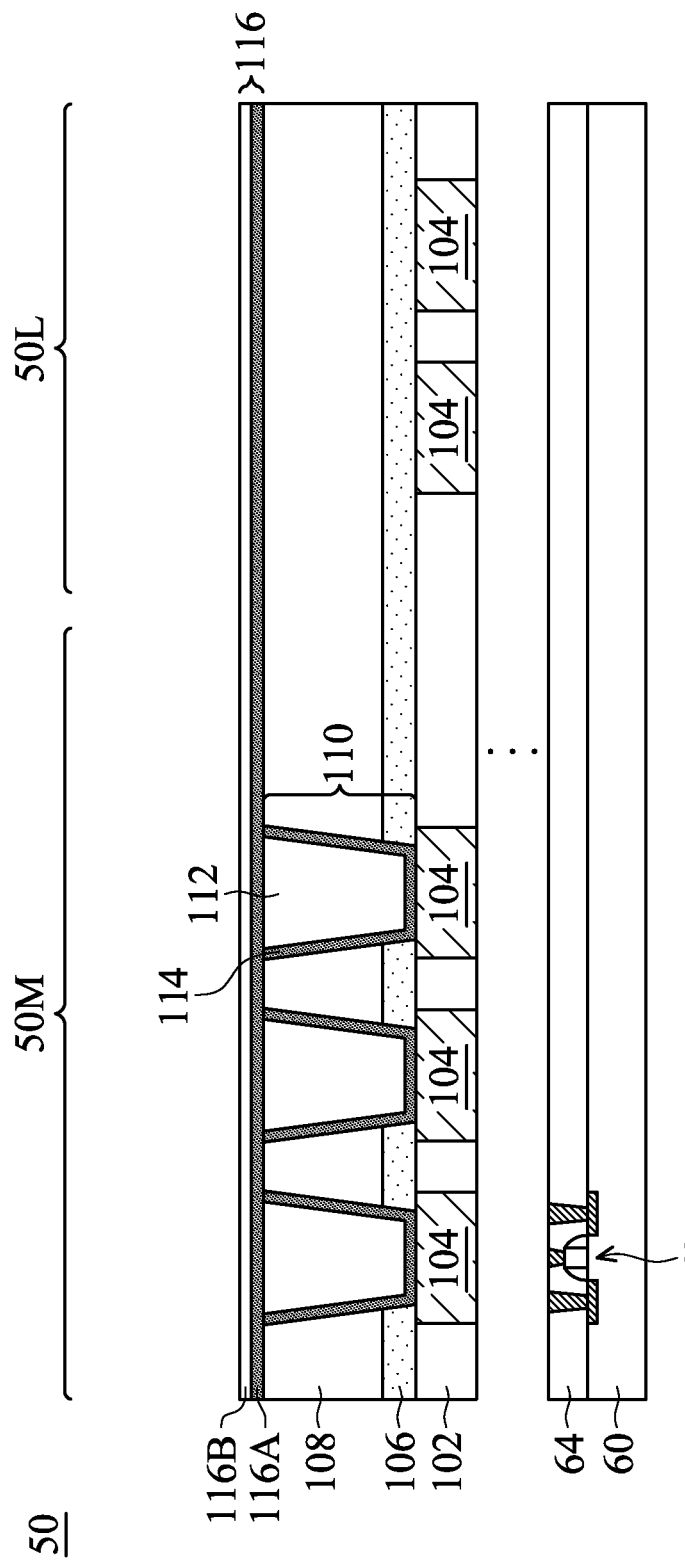
FIGS. 3 through 15 are various views of intermediate stages in the manufacturing of an interconnect structure for a semiconductor device, in accordance with some embodiments.

In FIG. 3, a metallization layer (e.g., M4, see FIG. 2) of the interconnect structure is formed. The metallization layer comprises an IMD layer 102 and conductive features 104 (which can correspond to the metal lines L4, see FIG. 2). The IMD layer 102 is formed over the ILD layer(s) 64. The IMD layer 102 may be formed of any suitable dielectric material, for example, a nitride such as silicon nitride; an oxide such as silicon oxide, phosphosilicate glass (PSG), borosilicate glass (BSG), boron-doped phosphosilicate glass (BPSG), or the like; or the like. The IMD layer 102 may be formed by any acceptable deposition process, such as spin coating, physical vapor deposition (PVD), chemical vapor deposition (CVD), the like, or a combination thereof. The IMD layer 102 may be a layer formed of a low-k dielectric material having a k-value lower than about 3.0. The IMD layer 102 may be a layer formed of an extra-low-k (ELK) dielectric material having a k-value of less than 2.5.

Conductive features 104 are formed in the IMD layer 102, and are electrically connected to the devices 62. In accordance with some embodiments, the conductive features 104 include diffusion barrier layers and conductive material over the diffusion barrier layers. Openings are formed in the IMD layer 102 using, e.g., an etching process. The openings expose underlying conductive features, such as underlying metal vias. The diffusion barrier layers may be formed of TaN, Ta, TiN, Ti, CoW, or the like, and may be formed in the openings by a deposition process such as atomic layer deposition (ALD) or the like. The conductive material may include copper, aluminum, tungsten, silver, and combinations thereof, or the like, and may be formed over the diffusion barrier layers in the openings by an electro-chemical plating process, CVD, ALD, PVD, the like, or a combination thereof. In an embodiment, the conductive material is copper, and the diffusion barrier layers are thin barrier layers that prevent the copper from diffusing into the IMD layer 102. After formation of the diffusion barrier layers and the conductive material, excess of the diffusion barrier layers and conductive material may be removed by, for example, a planarization process such as a chemical mechanical polish (CMP) process. In some embodiments, the conductive features 104 are metal lines.

An etch stop layer 106 is formed on the conductive features 104 and IMD layer 102. The etch stop layer 106 may be formed of a dielectric material such as aluminum nitride, aluminum oxide, silicon oxide, silicon nitride, silicon oxynitride, silicon carbide, a combination thereof, or the like. The etch stop layer 106 may be formed by chemical vapor deposition (CVD), physical vapor deposition (PVD), ALD, a spin-on-dielectric process, the like, or a combination thereof. The etch stop layer 106 may also be a composite layer formed of a plurality of dielectric sub-layers. For example, the etch stop layer 106 may include a silicon carbide sub-layer and an aluminum oxide sub-layer formed on the silicon carbide sub-layer, with the aluminum oxide sub-layer having a thickness in the range of about 10 Å to about 70 Å, and the silicon carbide sub-layer having a thickness in the range of about 80 Å to about 200 Å. The silicon carbide sub-layer is used as a glue layer to improve adhesion between the underlying layer and the aluminum oxide sub-layer.

An IMD layer 108 is formed on the etch stop layer 106. In some embodiments, the IMD layer 108 is formed of a tetraethyl orthosilicate (TEOS) oxide (e.g., silicon oxide deposited using, e.g., a chemical vapor deposition (CVD) process with TEOS as a precursor). In some embodiments, the IMD layer 108 may be formed using PSG, BSG, BPSG, undoped silicate glass (USG), fluorosilicate glass (FSG), SiOCH, flowable oxide, a porous oxide, or the like, or combinations thereof. The IMD layer 108 may also be formed of a low-k dielectric material with a k value lower than about 3.0, for example. The IMD layer 108 can be formed to a thickness in the range of about 500 Å to about 1500 Å.

Conductive vias 110 are formed extending through the IMD layer 108 and etch stop layer 106. The conductive vias 110 can also be referred to as bottom vias. In some embodiments, the conductive vias 110 include conductive regions 112 and conductive barrier layers 114 lining sidewalls and bottom surfaces of the conductive regions 112. The conductive barrier layers 114 may be formed of titanium, titanium nitride, tantalum, tantalum nitride, cobalt, a combination thereof, or the like. The conductive regions 112 may be formed of metals such as copper, aluminum, tungsten, cobalt, alloys thereof, or the like. The formation of the conductive vias 110 may include etching the IMD layer 108 and etch stop layer 106 to form via openings, forming a blanket conductive barrier layer extending into the via openings, depositing a metallic material over the blanket conductive barrier layer, and performing a planarization process, such as a CMP process or a mechanical grinding process, to remove excess portions of the blanket conductive barrier layer and the metallic material.

One or more bottom electrode layer(s) 116 are formed on the conductive vias 110 and IMD layer 108. In some embodiments, the bottom electrode layer(s) 116 are formed as blanket layers, and may be formed using CVD, physical vapor deposition (PVD), electro-chemical plating (ECP), electroless plating, or the like. The bottom electrode layer(s) 116 may be formed of conductive materials such as Cu, Al, Ti, Ta, W, Pt, Ni, Cr, Ru, TiN, TaN, combinations thereof, multilayers thereof, or the like. For example, the bottom electrode layer(s) 116 can comprise a first bottom electrode layer 116A and a second bottom electrode layer 116B over the first bottom electrode layer 116A. The first bottom electrode layer 116A can be made of a first conductive material, such as TaN, and the second bottom electrode layer 116B can be made of a second conductive material, such as TiN. In some embodiments, the first bottom electrode layer 116A has a thickness in the range of about 20 Å to about 100 Å. In some embodiments, the second bottom electrode layer 116B has a thickness of up to about 100 Å. In some embodiments, the second bottom electrode layer 116B is omitted, such as in embodiments where a single bottom electrode layer 116 is formed.

Figure 4:
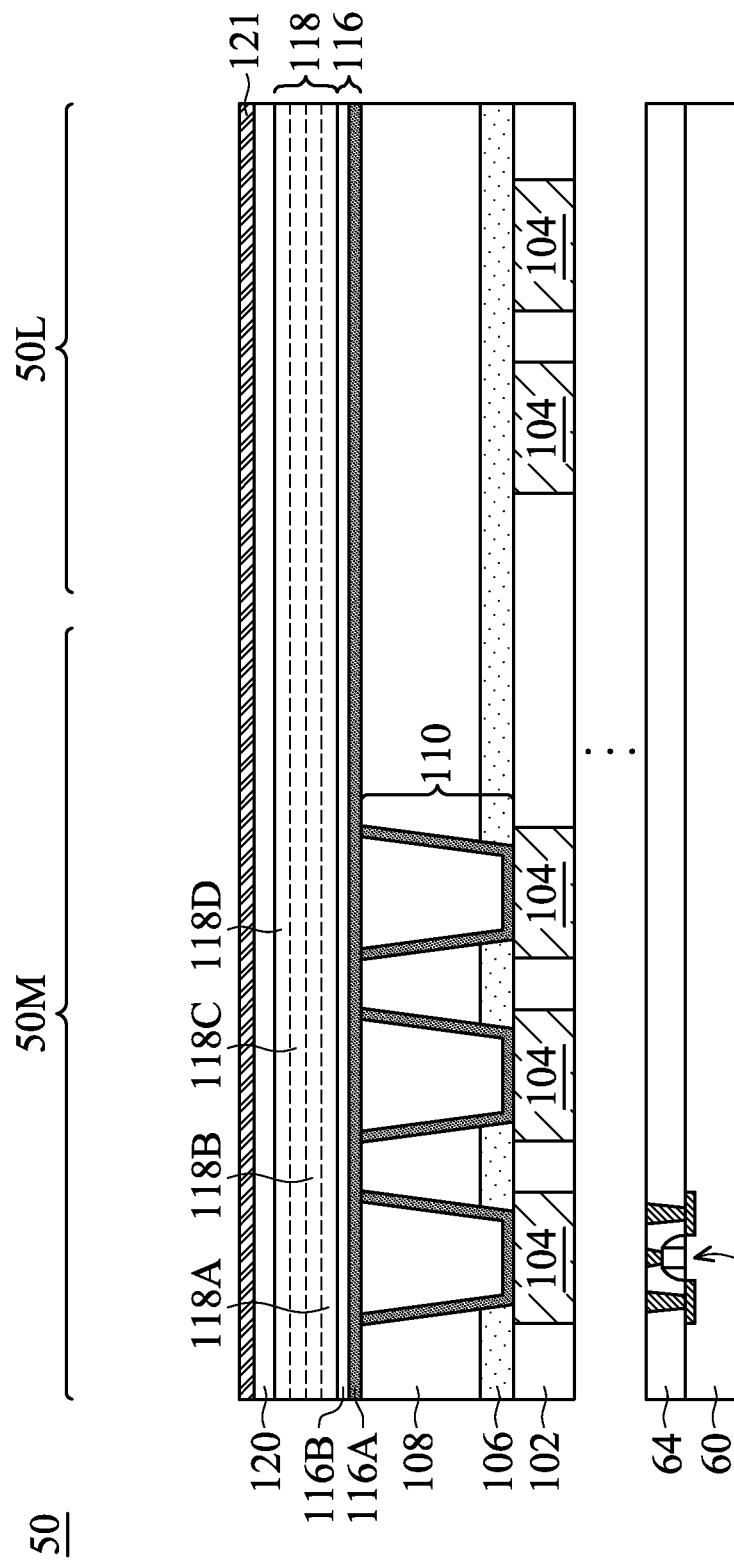

In FIG. 4, a MTJ film stack 118 is formed on the bottom electrode layer(s) 116. The MTJ film stack 118 is a multilayer that includes an anti-ferromagnetic layer 118A, a pinned layer 118B over the anti-ferromagnetic layer 118A, a tunnel barrier layer 118C over the pinned layer 118B, and a free layer 118D over the tunnel barrier layer 118C. The MTJ film stack 118 has an overall thickness in the range of about 200 Å to about 400 Å. Each layer of the MTJ film stack 118 may be deposited using one or more deposition methods such as, CVD, PVD, ALD, a combination thereof, or the like.

The anti-ferromagnetic layer 118A may be formed of a metal alloy including manganese (Mn) and one or more other metal(s) such as platinum (Pt), iridium (Ir), rhodium (Rh), nickel (Ni), palladium (Pd), iron (Fe), osmium (Os), or the like. For example, the anti-ferromagnetic layer 118A can be formed of PtMn, IrMn, RhMn, NiMn, PdPtMn, FeMn, OsMn, or the like. The anti-ferromagnetic layer 118A may have a thickness in the range of about 50 Å to about 200 Å.

The pinned layer 118B may be formed of a ferromagnetic material with a greater coercivity field than the free layer 118D, such as cobalt iron (CoFe), cobalt iron boron (CoFeB), a combination thereof, or the like. The pinned layer 118B may have a thickness in the range of about 50 Å to about 200 Å. In some embodiments, the pinned layer 118B has a synthetic ferromagnetic (SFM) structure, in which the coupling between magnetic layers is ferromagnetic coupling. The pinned layer 118B may also adopt a synthetic antiferromagnetic (SAF) structure including a plurality of magnetic metal layers separated by a plurality of non-magnetic spacer layers. The magnetic metal layers may be formed of Co, Fe, Ni, or the like. The non-magnetic spacer layers may be formed of Cu, Ru, Ir, Pt, W, Ta, Mg, or the like. For example, the pinned layer 118B may have a Co layer and repeated $(Pt/Co)_x$ layers over the Co layer, with x representing repeating number that can be any integer equal to or greater than 1, such as an integer in the range of about 3 to about 20.

The tunnel barrier layer 118C may be formed of a dielectric material, such as MgO, AlO, AlN, a combination thereof, or the like. The tunnel barrier layer 118C may have a thickness in the range of about 1 nm to about 10 nm. The tunnel barrier layer 118C is thicker than the other layers of the MTJ film stack 118.

The free layer 118D may be formed of a suitable ferromagnetic material such as CoFe, NiFe, CoFeB, CoFeBW, a combination thereof, or the like. The free layer 118D may also adopt a synthetic ferromagnetic structure, which is similar to a SAF structure, with the thickness of the non-magnetic spacer layers adjusted to achieve the ferromagnetic coupling between the separated magnetic metals, e.g., causing the magnetic moment to be coupled in the same direction. The magnetic moment of the free layer 118D is programmable, and the resistances of the resulting MTJ stacks is accordingly programmable. Specifically, the resistances of the resulting MTJ stacks can be changed between a high resistance ($R_{ap}$) and a low resistance ($R_p$) based on the programmed magnetic moment of the free layer 118D. As such, the resulting MTJ stacks can also be referred to as programmable resistance elements or programmable resistors. The thickness of the tunnel barrier layer 118C contributes to the $R_{ap}$ and the $R_p$ of the resulting MTJ stacks.

It should be appreciated that the materials and the structure of the MTJ film stack 118 may have many variations, which are also within the scope of the present disclosure. For example, the layers 118A, 118B, 118C, and 118D may be formed in an order inversed from that described above. Accordingly, the free layer 118D may be the bottom layer of the MTJ film stack 118, and the anti-ferromagnetic layer 118A may be the top layer of the MTJ film stack 118.

A first top electrode layer 120 is formed on the MTJ film stack 118. In some embodiments, the first top electrode layer 120 is formed as a blanket layer, and may be formed using CVD, PVD, ECP, electroless plating, or the like. The first top electrode layer 120 is a conductive layer, and may include metals such as titanium, tantalum, tungsten, aluminum, copper, alloys thereof, multi-layers thereof, or the like. For example, the first top electrode layer 120 can be formed of TiN, Ta, TaN, Ti, Ru, W, WC, multi-layers thereof, or the like. In some embodiments, the first top electrode layer 120 is formed of titanium nitride. In some embodiments, the first top electrode layer 120 has a thickness in the range of about 50 Å to about 200 Å. In some embodiments, the thickness of the first top electrode layer 120 is greater than the combined thickness of the bottom electrode layer(s) 116. The first top electrode layer 120 is used as a hard mask in the subsequent patterning of the MTJ film stack 118.

A mask layer 121 is formed on the first top electrode layer 120. In some embodiments, the mask layer 121 is formed of silicon oxide. In other embodiments, the mask layer 121 may be formed using PSG, BSG, BPSG, USG, FSG, SiOCH, flowable oxide, a porous oxide, or the like, or combinations thereof. The mask layer 121 may also be formed of a low-k dielectric material with a k value lower than about 3.0, for example. The mask layer 121 can be formed to a thickness in the range of about 100 Å to about 300 Å. In some embodiments, the mask layer 121 is formed using similar materials and methods as the IMD layer 108. For example, the mask layer 121 and IMD layer 108 can both be formed of silicon oxide.

Figure 5:
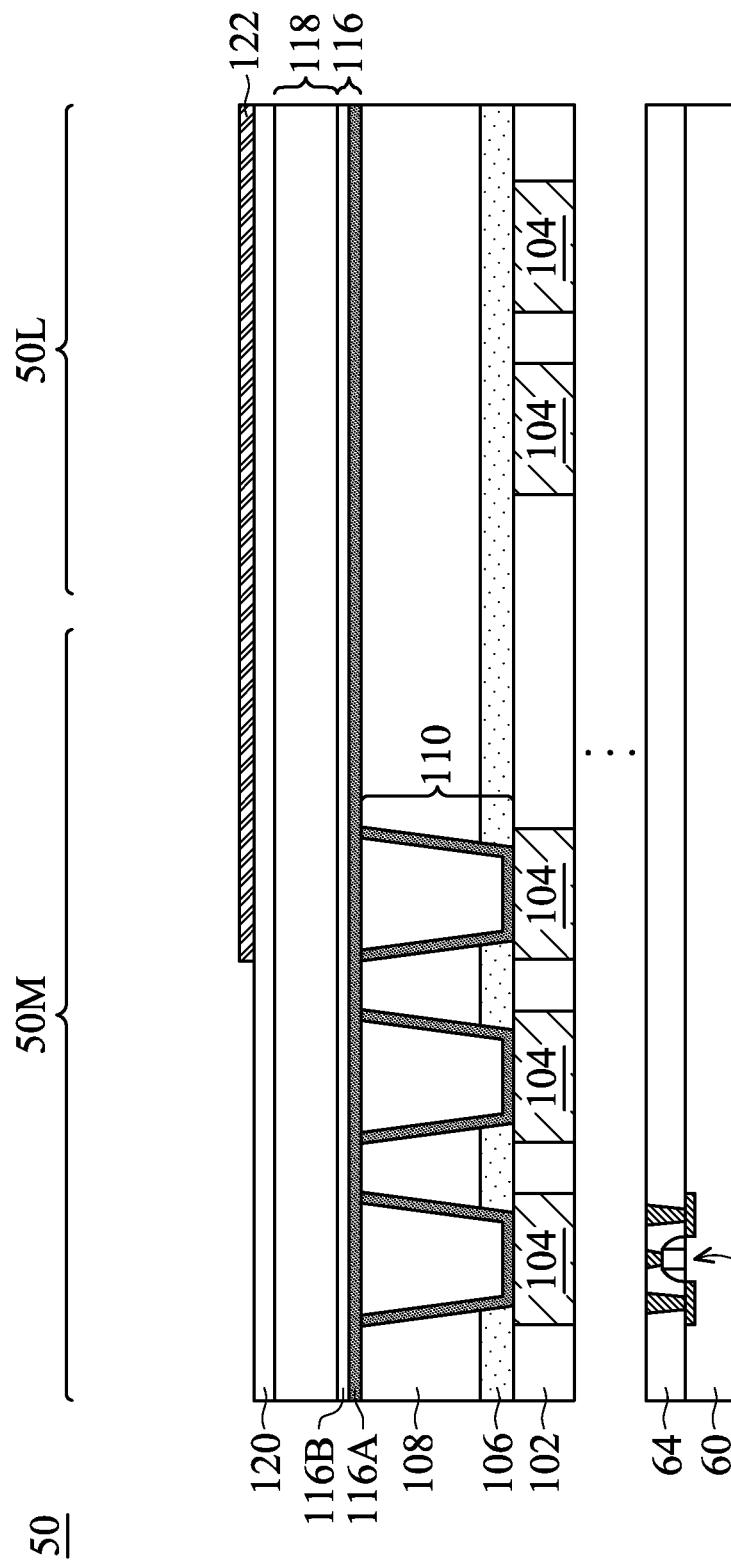

In FIG. 5, the mask layer 121 is patterned to expose portions of the first top electrode layer 120 outside of the logic region 50L. The patterning process forms a protective mask 122, which comprises remaining portions of the mask layer 121. In the illustrated embodiment, the protective mask 122 covers all of the logic region 50L and a portion of the memory region 50M. For example, the protective mask 122 can cover up to about 1% of the memory region 50M. Specifically, the protective mask 122 can cover all of the logic region 50L and one row/column of conductive vias 110 (e.g., one row/column of MRAM cells 58, see FIG. 8) at the interface of the logic region 50L and memory region 50M. In other embodiments (discussed further below), the protective mask 122 covers a portion of the logic region 50L, and exposes all of the memory region 50M. The patterning process can be performed by suitable photolithography and etching processes. For example, a mask such as a photoresist can be patterned covering the logic region 50L, the protective mask 122 can be formed using the mask, and the mask then removed.

After the protective mask 122 is patterned, the exposed portions of the first top electrode layer 120 can have a reduced thickness, such as a thickness in the range of about 30 Å to about 150 Å. Alternatively, the thickness of the first top electrode layer 120 may be substantially unchanged by the patterning.

Figure 6:
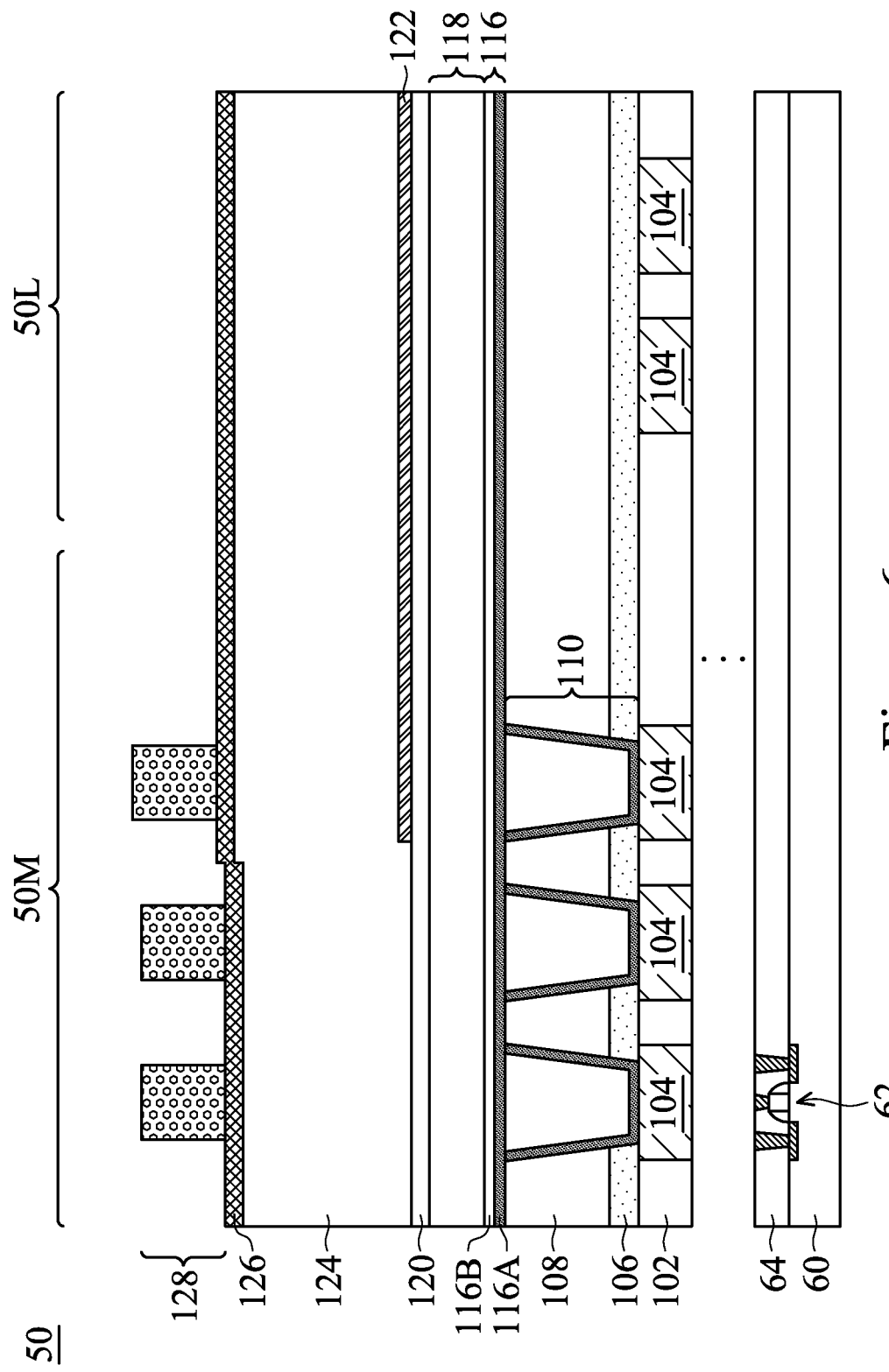

In FIG. 6, a second top electrode layer 124 is formed on the protective mask 122 and the exposed portions of the first top electrode layer 120. In some embodiments, the second top electrode layer 124 is formed as a blanket layer, and may be formed using CVD, PVD, ECP, electroless plating, or the like. The second top electrode layer 124 is a conductive layer, and may include metals such as titanium, tantalum, tungsten, aluminum, copper, alloys thereof, multi-layers thereof, or the like. For example, the second top electrode layer 124 can be formed of TiN, Ta, TaN, Ti, Ru, W, WC, multi-layers thereof, or the like. In some embodiments, the second top electrode layer 124 is formed using similar materials and methods as the first top electrode layer 120. For example, the first top electrode layer 120 and second top electrode layer 124 can both be titanium nitride. In other embodiments, the first top electrode layer 120 and second top electrode layer 124 can be different materials. In some embodiments, the second top electrode layer 124 has a thickness in the range of about 300 Å to about 1200 Å. The thickness of the second top electrode layer 124 can be greater than the thickness of the first top electrode layer 120. The second top electrode layer 124 is used as a hard mask in the subsequent patterning of the MTJ film stack 118.

After forming the second top electrode layer 124, one or more masks are formed over the second top electrode layer 124. In some embodiments, the one or more masks may comprise one or more hard masks, a tri-layer mask, a combination thereof, or the like. For example, a hard mask layer 126 can be formed over the second top electrode layer 124 and a photosensitive mask 128 can be formed over the hard mask layer 126. In some embodiments, the hard mask layer 126 is formed of an oxide such as titanium oxide, silicon oxide, a combination thereof, or the like. In some embodiments, the hard mask layer 126 has a thickness in the range of about 50 Å to about 300 Å. The photosensitive mask 128 may be a photoresist, such as a single-layer photoresist, a bi-layer photoresist, a tri-layer photoresist, or the like. The photosensitive mask 128 is formed in the memory region 50M, with the pattern of the photosensitive mask 128 corresponding to the pattern of the subsequently formed MRAM cells.

Figure 7:
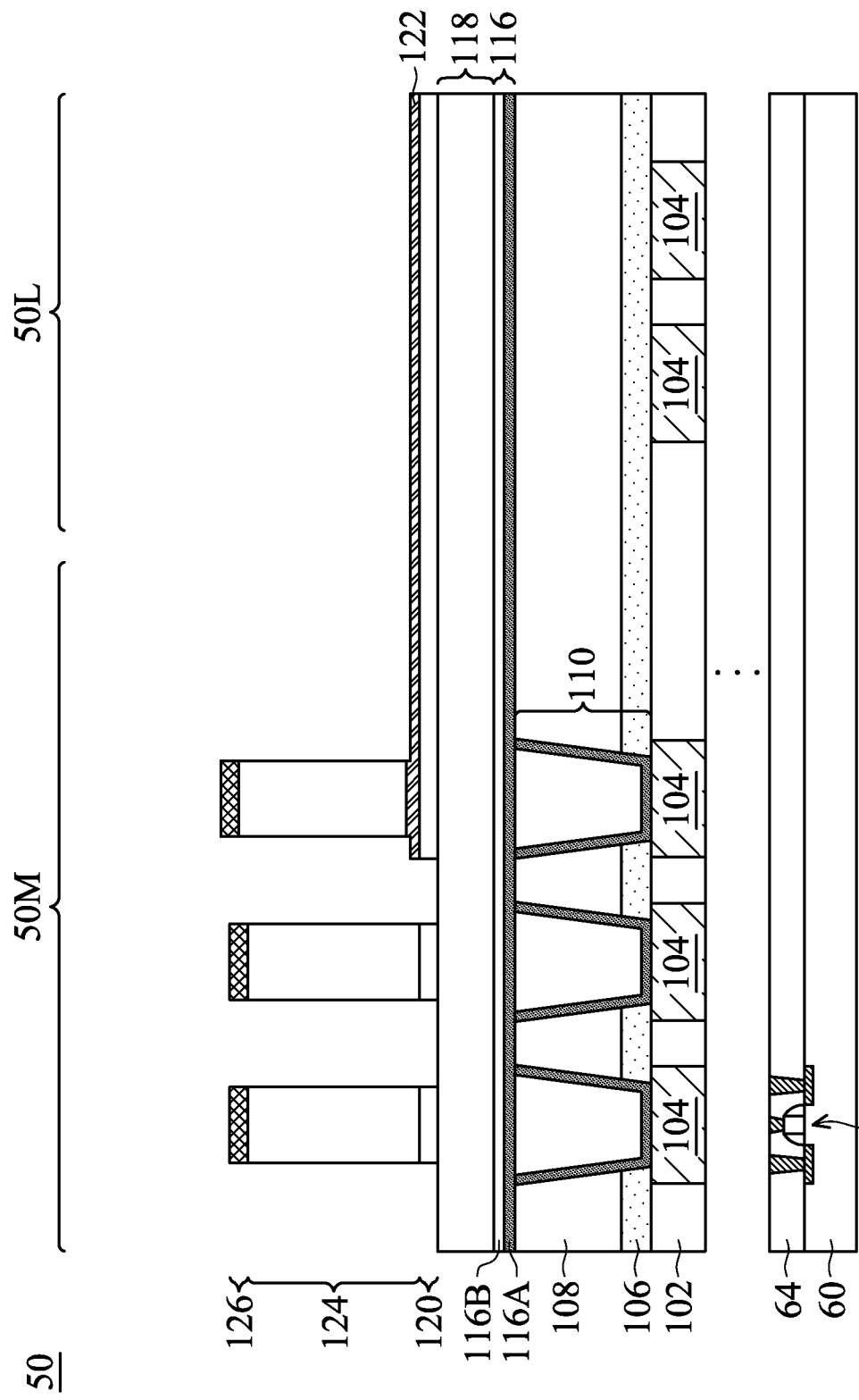

In FIG. 7, the photosensitive mask 128 is used as an etching mask to etch and pattern the hard mask layer 126, second top electrode layer 124, and exposed portions of the first top electrode layer 120. The etching method may include a plasma etching method, such as ion beam etching (IBE). The etching may be implemented using glow discharge plasma (GDP), capacitive coupled plasma (CCP), inductively coupled plasma (ICP), or the like. The photosensitive mask 128 may be consumed in the etching process.

After the etching process, exposed portions of the protective mask 122 can have a reduced thickness, such as a thickness in the range of about 30 Å to about 150 Å. Alternatively, the thickness of the protective mask 122 may be substantially unchanged by the etching process. After the etching process, both the protective mask 122 and MTJ film stack 118 can be exposed.

Figure 8:
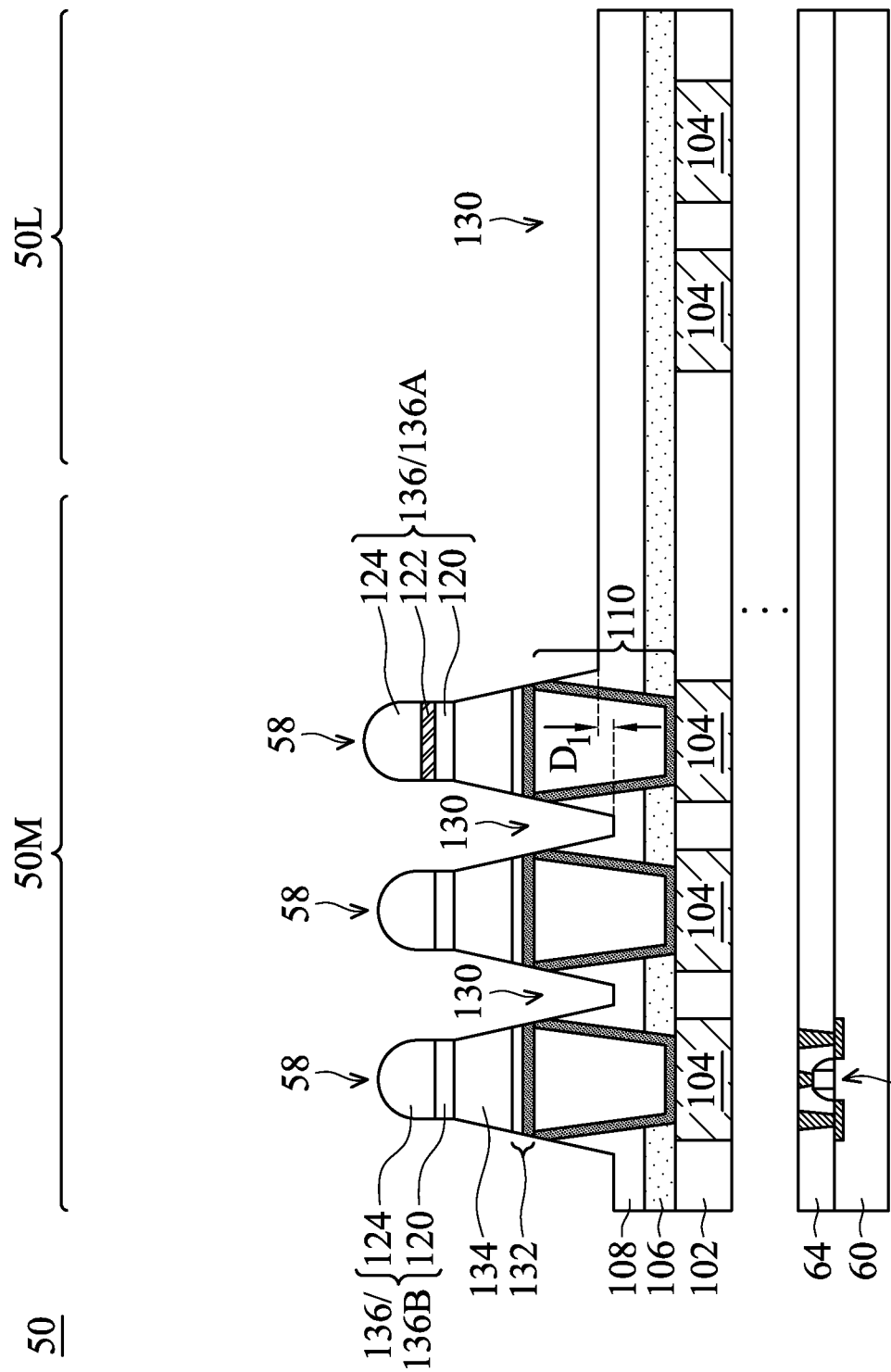

In FIG. 8, the patterned hard mask layer 126 and second top electrode layer 124 are together used as an etching mask to etch and pattern the protective mask 122, first top electrode layer 120, MTJ film stack 118, and bottom electrode layer(s) 116. The patterning may include one or more etching processes, and forms recesses 130 in the IMD layer 108. The etching method may include a plasma etching method, such as ion beam etching (IBE). The etching may be implemented using glow discharge plasma (GDP), capacitive coupled plasma (CCP), inductively coupled plasma (ICP), or the like. For example, when the etching method is an IBE process, it can be performed with etchants such as Ar, He, Ne, Xe, $O_2$, $N_2$, methanol ($CH_3OH$, i.e., MeOH), CO, ammonia ($NH_3$), the like, or a combination there, at a pressure in the range of about 0.05 mTorr and about 0.7 mTorr, and at a temperature in the range of about 10° C. and about 60° C. The patterned hard mask layer 126 may be consumed during the etching process.

The etching process forms bottom electrodes 132, MTJ stacks 134, and top electrodes 136 (including top electrodes 136A and 136B), which together form MRAM cells 58. Each MRAM cell 58 includes a bottom electrode 132, a MTJ stack 134, and a top electrode 136. The bottom electrodes 132 comprise remaining portions of the bottom electrode layer(s) 116. The MTJ stacks 134 comprise remaining portions of the MTJ film stack 118. The top electrodes 136 comprise remaining portions of the first top electrode layer 120 and second top electrode layer 124. As discussed further below, a first subset of the top electrodes 136A further comprises remaining portions of the protective mask 122, but a second subset of the top electrodes 136B does not include remaining portions of the protective mask 122. In some embodiments, the etching process partially etches the IMD layer 108 and conductive vias 110. In such embodiments, the remaining portions of the IMD layer 108 have sloped sidewalls, and have trapezoidal shapes in the illustrated cross-section. The MTJ stacks 134 and bottom electrodes 132 also have sloped sidewalls, and have trapezoidal shapes in the illustrated cross-section. Further, the top electrodes 136 have domed top surfaces.

As noted above, the etching process may include the use of a plasma etching method, such as an IBE process. IBE offers a high level of precision (e.g., high anisotropism), which can help control the profile of the MTJ stacks 134. However, redeposition can occur during IBE, and in particular, metal elements etched by IBE can be re-sputtered on sidewalls of the MTJ stacks 134. The existence of etching residue (e.g., the from MTJ film stack 118 or bottom electrode layer(s) 116) on the sidewalls of the MTJ stacks 134 can change the resistance of the MTJ stacks 134, causing the resulting MRAM cells 58 to have unexpected high resistance ($R_{ap}$) and low resistance ($R_p$) values. For example, the presence of conductive etching residue can short the various layers of the MTJ stacks 134, reducing the expected resistance values for the MTJ stacks 134. The amount of etching residue can be reduced by performing the IBE process for a long duration, such as a duration in the range of about 100 seconds to about 600 seconds, which helps increase consumption of the etching residue.

As noted above, the second top electrode layer 124 can be formed using similar materials and methods as the first top electrode layer 120, and the protective mask 122 can be formed using similar materials and methods as the IMD layer 108. For example, the first top electrode layer 120 and second top electrode layer 124 can be formed of a same conductive electrode material, such as titanium nitride, and the protective mask 122 and IMD layer 108 can be formed of a same dielectric isolation material, such as silicon oxide. The electrode material and isolation material have a moderate etch selectivity relative the IBE process. For example, the ratio of the etch rate of the isolation material to the etch rate of the electrode material, relative the IBE process, can be in the range of about 1:1 to about 1:2.5. In embodiments where the first top electrode layer 120 is multi-layered, at least the topmost sub-layer of the first top electrode layer 120 has a moderate etch selectivity with the isolation material relative the IBE process. A moderate etch selectivity between the electrode material and isolation material helps protect the logic region 50L from damage by over-etching during the IBE process. Specifically, the moderate etch selectivity slows but does not stop the IBE process in the logic region 50L, which can help prevent the IBE process from etching completely through the IMD layer 108 in the logic region 50L. Sandwiching the protective mask 122 between the first top electrode layer 120 and second top electrode layer 124 can thus help protect the conductive features 104 from over-etching that would otherwise occur as a result of the long duration of the IBE process and pattern loading effects in the memory region 50M.

As noted above, in this embodiment, the protective mask 122 (see FIG. 5) covers all of the logic region 50L and a portion of the memory region 50M. As such, at least some of the MTJ stacks 134 were covered by the protective mask 122 before the IBE process. The MRAM cells 58 thus have two different types of top electrodes 136. The top electrodes 136A are electrodes near the interface of the memory region 50M and logic region 50L, which correspond to MRAM cells 58 that were covered by the protective mask 122. As a result, the top electrodes 136A can include portions of the patterned protective mask 122. The top electrodes 136B are electrodes at the interior of the memory region 50M, which correspond to MRAM cells 58 that were uncovered by the protective mask 122. As noted above, the protective mask 122 is a dielectric material. The top electrodes 136A thus have a greater resistance than the top electrodes 136B. As such, the MRAM cells 58 with the top electrodes 136A thus have increased high resistance ($R_{ap}$) and low resistance ($R_p$) values compared to the MRAM cells 58 with the top electrodes 136B. Further, the top electrodes 136A have a greater thickness than the top electrodes 136B. For example, the top electrodes 136A and 136B can have a thickness in the range of about 200 Å to about 400 Å, and the top electrodes 136A can be thicker than the top electrodes 136B by the thickness of the protective mask 122, e.g., by a thickness in the range of about 30 Å to about 150 Å. Further, as a result of the differences in etch selectivity, the portions of the IMD layer 108 covered by the protective mask 122 are recessed less than portions of the IMD layer 108 uncovered by the protective mask 122. Specifically, the recesses 130 differ in depth by a distance Di, which can be in the range of about 60 Å to about 300 Å.

Figure 9:
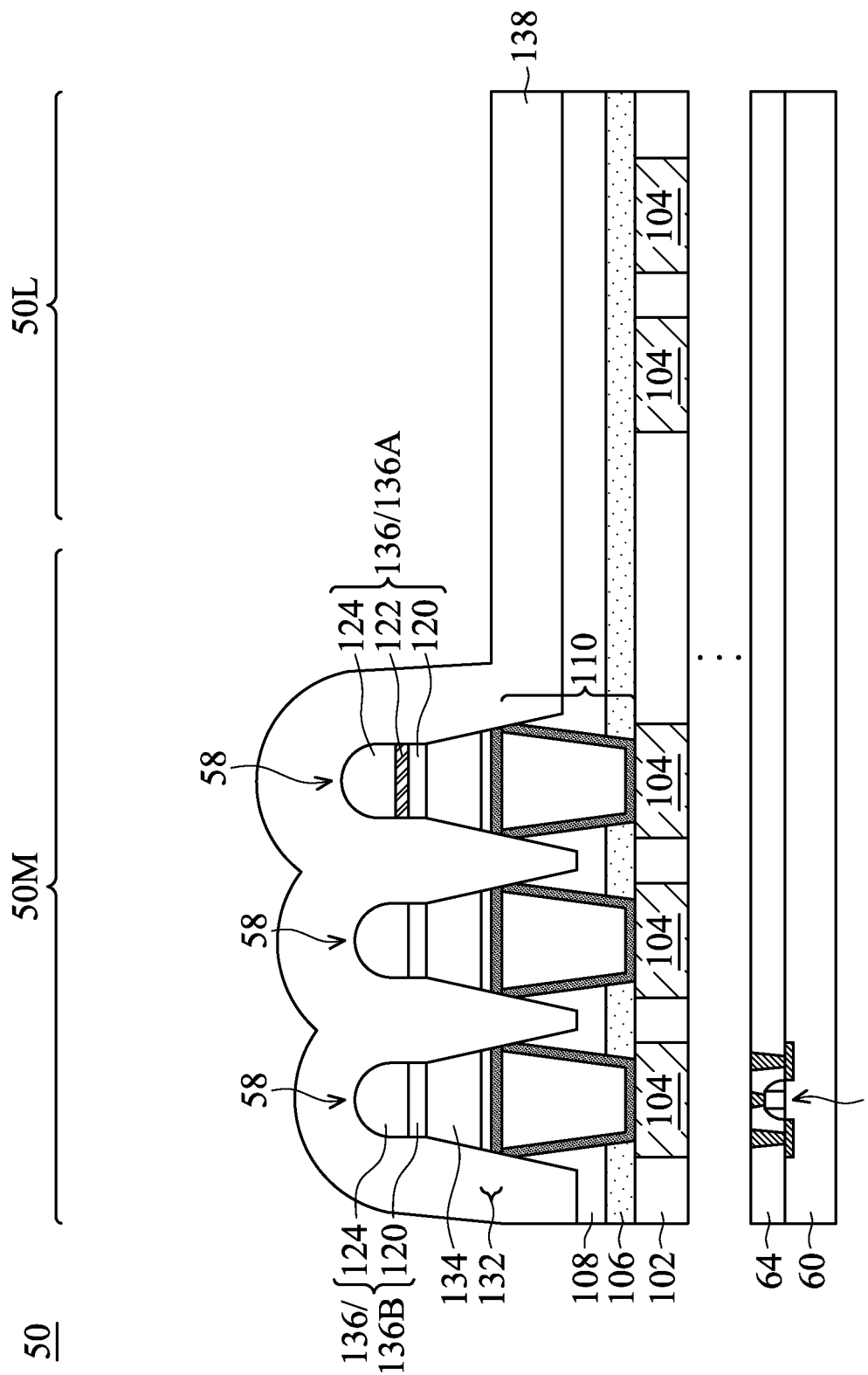

In FIG. 9, a passivation layer 138 is blanket formed over the MRAM cells 58 and in the recesses 130 (see FIG. 8). In some embodiments, the passivation layer 138 may comprise silicon oxide, silicon nitride, silicon oxynitride, silicon carbide, silicon carbonitride, a combination thereof, or the like, and may be formed using CVD, plasma-enhanced chemical vapor deposition (PECVD), ALD, plasma-enhanced atomic layer deposition (PEALD), PVD, a combination thereof, or the like. In some embodiments, the passivation layer 138 may reduce or prevent moisture (e.g., $H_2O$) diffusion into the MRAM cells 58 during subsequent processing. In some embodiments, the passivation layer 138 may have a thickness in the range of about 100 Å to about 800 Å.

Figure 10:
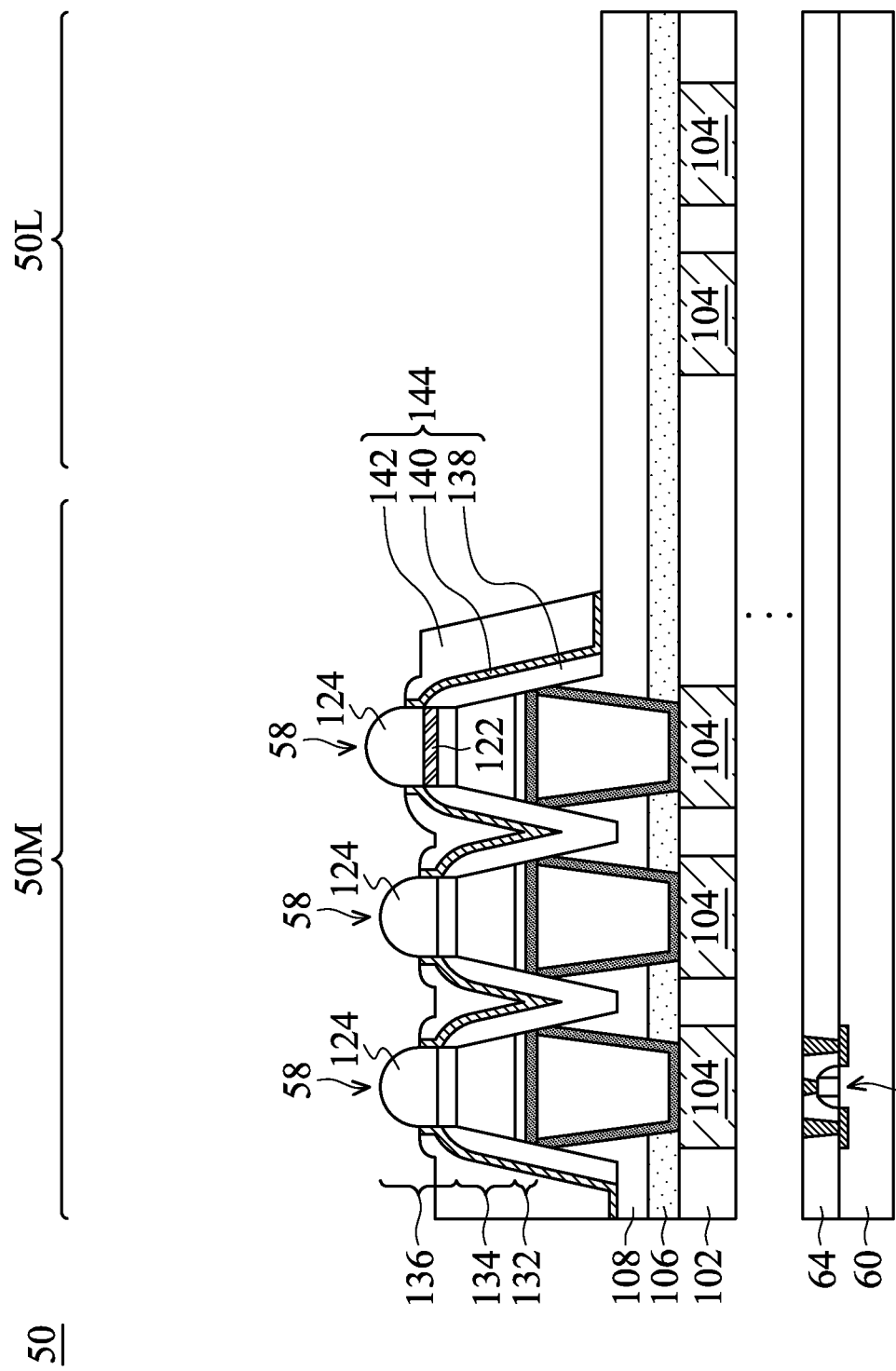

In FIG. 10, the passivation layer 138 is patterned to expose top portions of the top electrodes 136. In some embodiments, the patterning is a dry etching process, such as an anisotropic etching process. The patterning removes horizontal portions of the passivation layer 138. Subsequently, another passivation layer 140 is formed over the passivation layer 138, and an oxide layer 142 formed over the passivation layer 140. In some embodiments, the passivation layer 140 is formed of one of the candidate materials and methods for the passivation layer 138, but is formed of a different material than the passivation layer 138. For example, the passivation layer 138 can be formed of an oxide, e.g., silicon oxide, and the passivation layer 140 can be formed of a nitride, e.g., silicon nitride. In some embodiments, the oxide layer 142 may comprise silicon oxide, or the like, and may be formed using CVD, PECVD, ALD, PEALD, a combination thereof, or the like. Subsequently, one or more dry etching processes are performed to etch the passivation layer 140 and the oxide layer 142 and to expose top portions of the top electrodes 136, such as top portions of the second top electrode layer 124. In some embodiments, the one or more dry etching processes are anisotropic etching processes and remove horizontal portions of the passivation layer 140 and the oxide layer 142. The remaining portions of the passivation layer 138, the passivation layer 140, and the oxide layer 142 form spacers 144 that are disposed on sidewalls of the MRAM cells 58. The IMD layer 108 in the logic region 50L is exposed after the spacers 144 are patterned.

Figure 11:
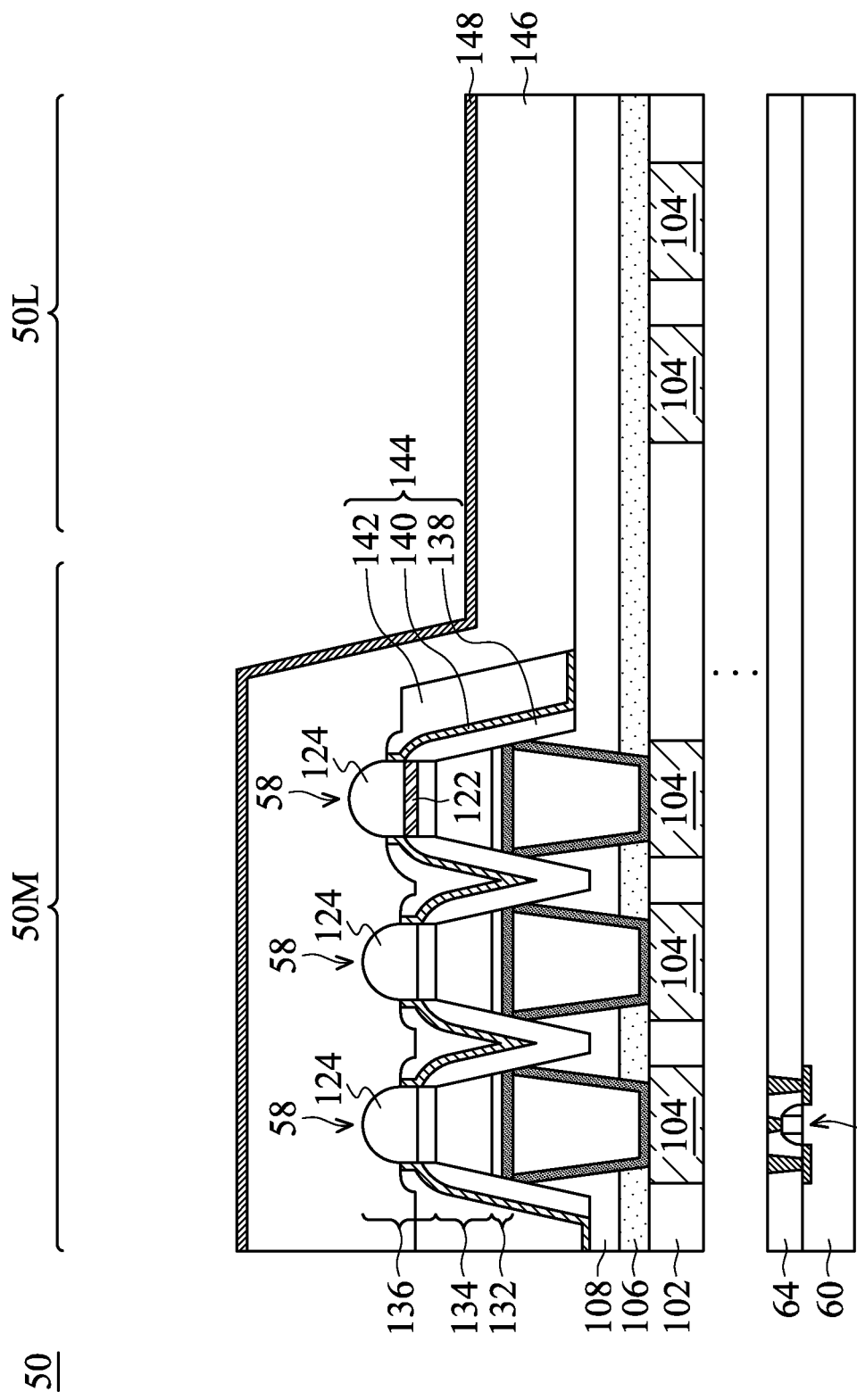

In FIG. 11, an IMD layer 146 is formed over the spacers 144, MRAM cells 58, and IMD layer 108. In some embodiments, the IMD layer 146 is formed using similar materials and methods as the IMD layer 108. An anti-reflective layer 148 is then formed on the IMD layer 146. The anti-reflective layer 148 may be a nitrogen-free anti-reflective layer (NFARL), and may be formed of a nitrogen-free dielectric material such as silicon oxycarbide. The IMD layer 146 and anti-reflective layer 148 will be used to protect the memory region 50M during subsequent processing of the logic region 50L.

Figure 12:
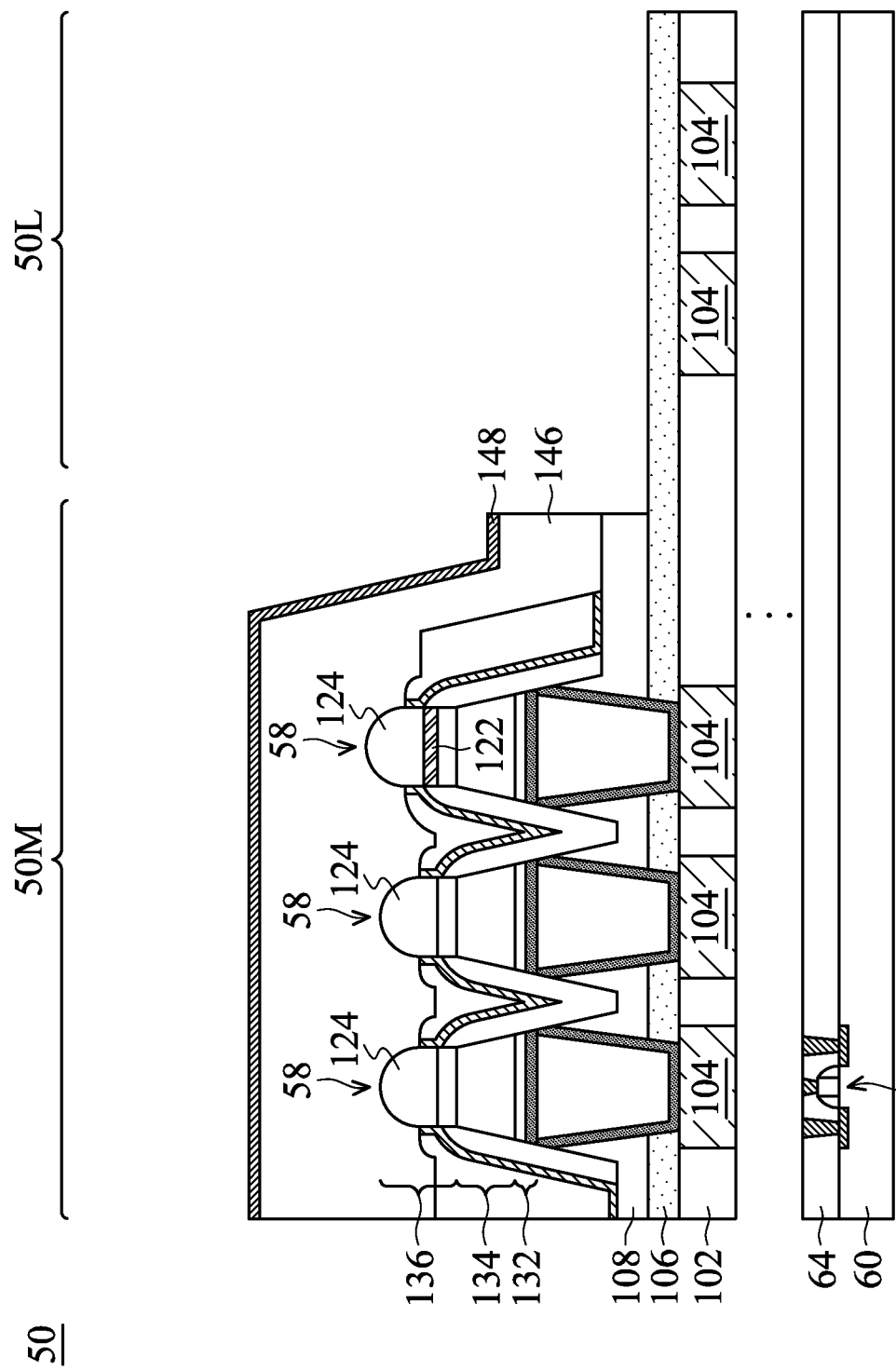

In FIG. 12, the anti-reflective layer 148, IMD layer 146, and IMD layer 108 are patterned to expose the etch stop layer 106 in the logic region 50L. In some embodiments, the patterning process may comprise suitable photolithography and etching processes. Portions of the anti-reflective layer 148 and IMD layer 146 in the memory region 50M remain after the patterning process.

Figure 13:
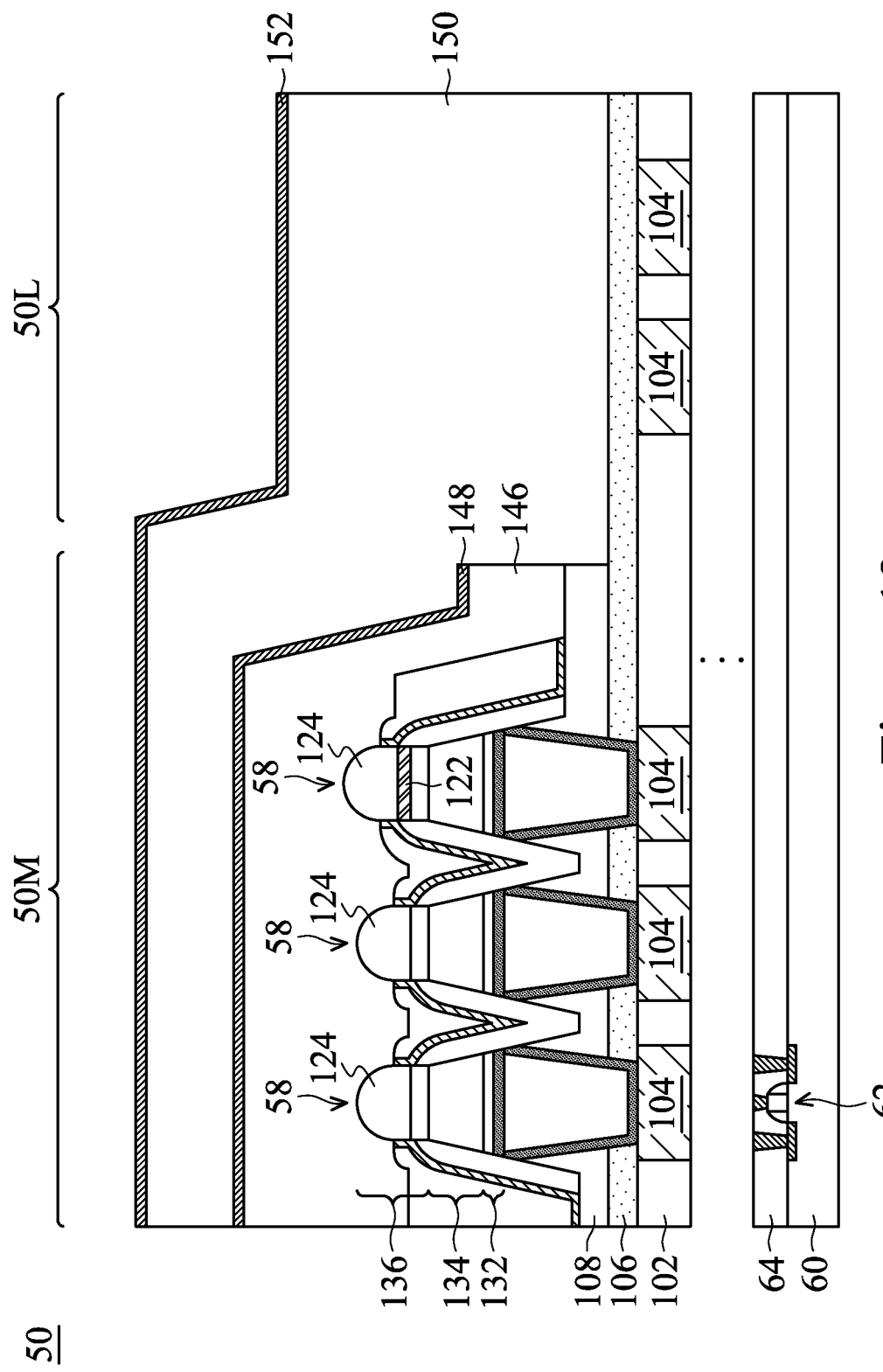

In FIG. 13, an IMD layer 150 is formed over the etch stop layer 106, the patterned IMD layer 146, and the patterned anti-reflective layer 148. In some embodiments, the IMD layer 150 is formed using similar materials and methods as the IMD layer 108. An anti-reflective layer 152 is then formed on the IMD layer 150. In some embodiments, the anti-reflective layer 152 is formed using similar materials and methods as the anti-reflective layer 148.

Figure 14:
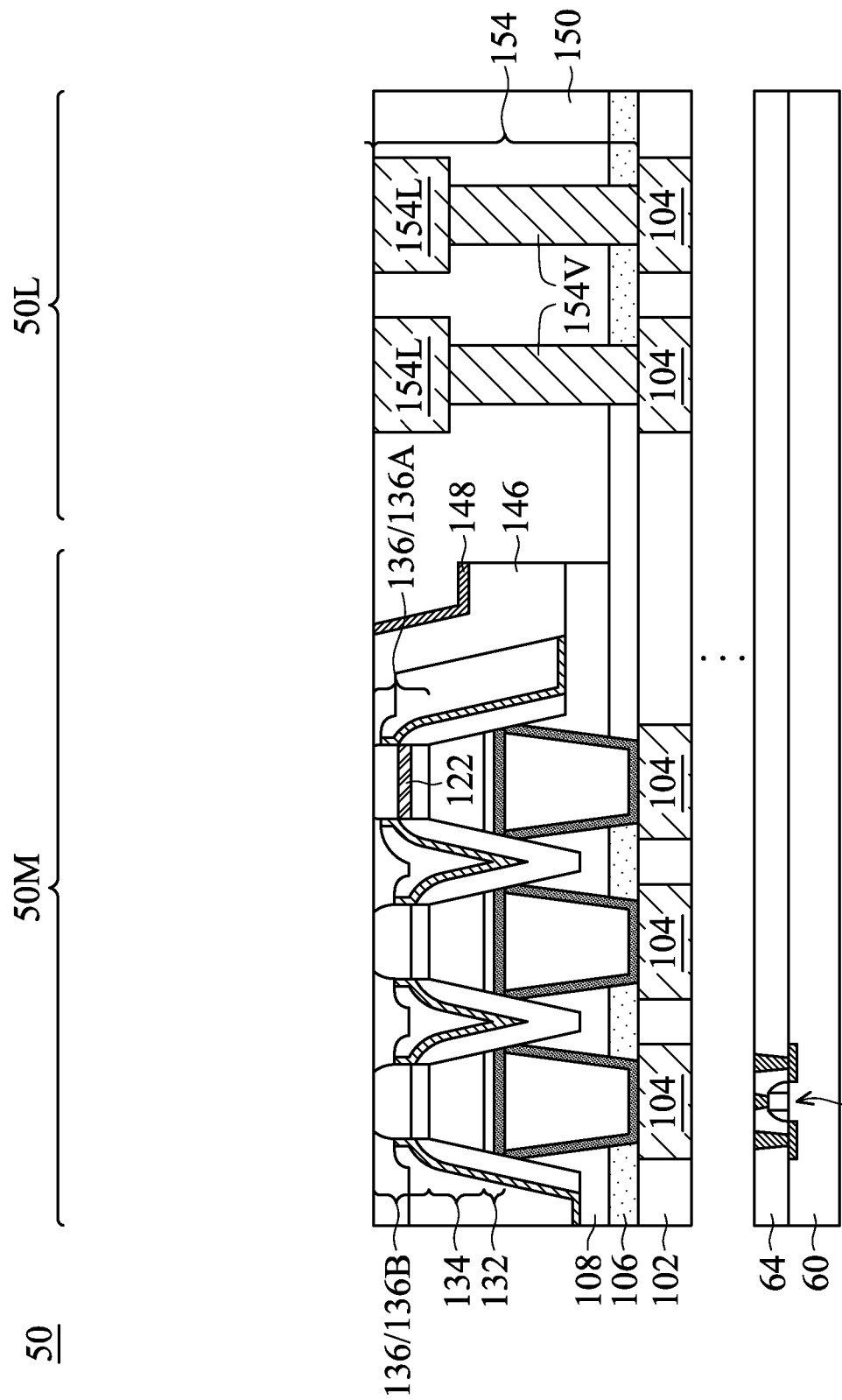

In FIG. 14, conductive features 154 are formed in the IMD layer 150 and etch stop layer 106. The conductive features 154 may include conductive lines 154L and conductive vias 154V, and are formed in the logic region 50L. The memory region 50M may be free from the conductive features 154. The conductive features 154 may be formed by suitable methods, such as a damascene process. Example damascene processes include single damascene processes, dual damascene processes, and the like. In some embodiments, the conductive feature openings are formed by a via-first process. In other embodiments, the conductive feature openings are formed by a trench-first process. Subsequently, the conductive feature openings are filled with suitable conductive materials, such as copper, aluminum, combinations thereof, or the like. Next, a planarization process, such a CMP process, is performed to remove excess materials over the memory region 50M and expose the topmost surfaces of the top electrodes 136. In some embodiments, the topmost surfaces of the top electrodes 136 (e.g., of the second top electrode layer 124) are planar with the topmost surfaces of the conductive features 154 after planarization. In some embodiments, the planarization process completely removes the anti-reflective layer 152 (see FIG. 13). After the planarization process, the top electrodes 136 have uniform thicknesses, e.g., the combined thickness of the constituent components of the top electrodes 136A is equal to the combined thickness of the constituent components of the top electrodes 136B. Although each conductive via 154V and corresponding conductive line 154L is illustrated as a separate element, it should be appreciated that they may be a continuous conductive feature, such as in embodiments where they are formed by a dual damascene process.

Figure 15:
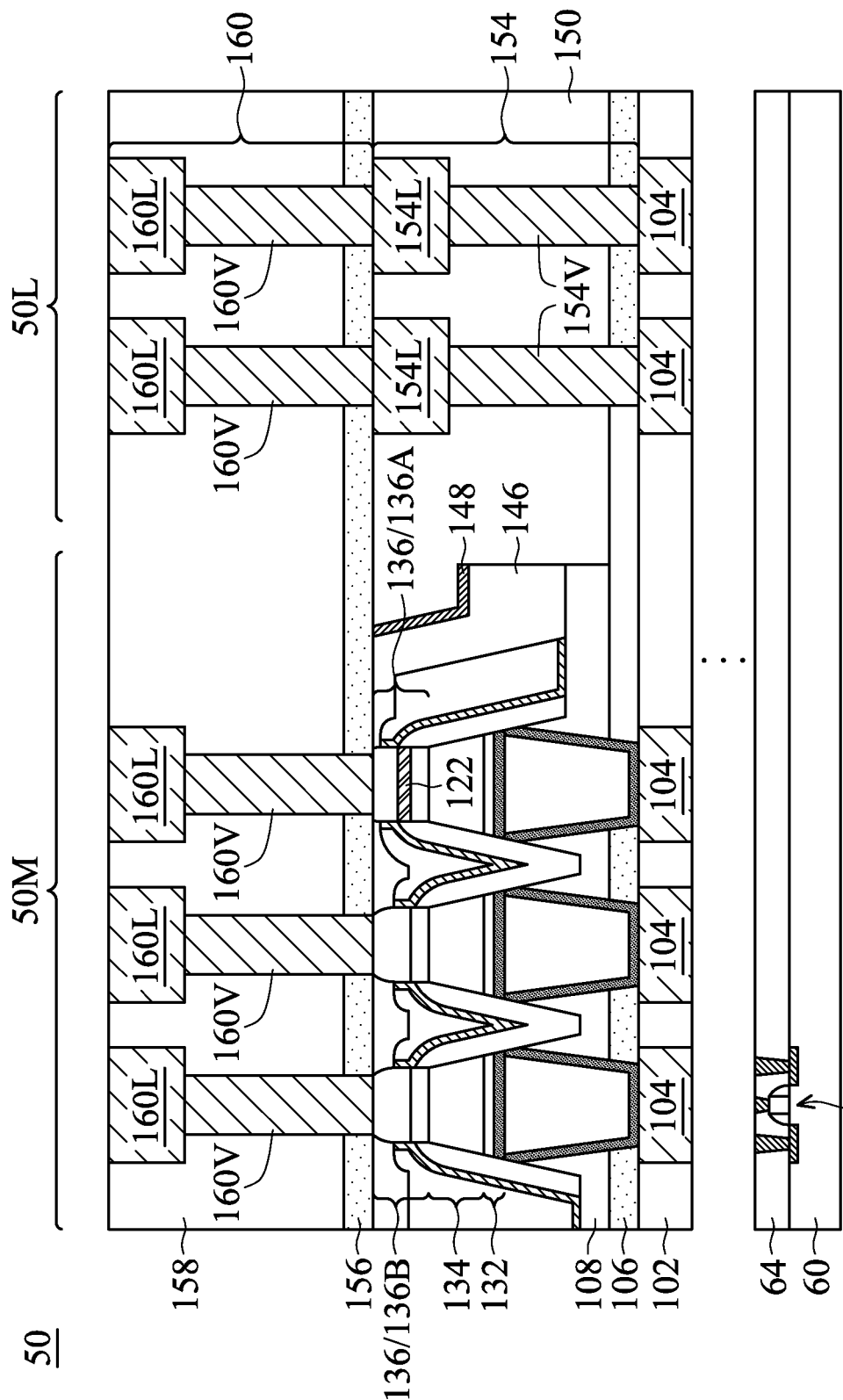

In FIG. 15, another metallization layer of the interconnect structure (e.g., M6, see FIG. 2) is formed. The metallization layer comprises an etch stop layer 156, an IMD layer 158, and conductive features 160. The conductive features 160 include conductive vias 160V (which can correspond to the metal vias V6, see FIG. 2) and conductive lines 160L (which can correspond to the metal lines L6, see FIG. 2), and are formed in both the logic region 50L and memory region 50M. In some embodiments, the etch stop layer 156 is formed using similar materials and methods as the etch stop layer 106. In some embodiments, the IMD layer 158 is formed using similar materials and methods as the IMD layer 150. In some embodiments, the conductive features 160 are formed using similar materials and methods as the conductive features 154. The conductive features 160 are electrically connected to the memory devices (e.g., MRAMs) formed in the memory region 50M and the logic devices (e.g., logic circuits) formed in the logic region 50L. Specifically, the conductive features 160 are physically and electrically connected to the conductive features 154 and top electrodes 136. In some embodiments, the conductive features 160 electrically connect the memory devices to the logic devices. For example, the conductive features 160 can be used to connect some of the conductive features 154 to some of the top electrodes 136. Although each conductive via 160V and corresponding conductive line 160L is illustrated as a separate element, it should be appreciated that they may be a continuous conductive feature, such as in embodiments where they are formed by a dual damascene process.

Figure 16:
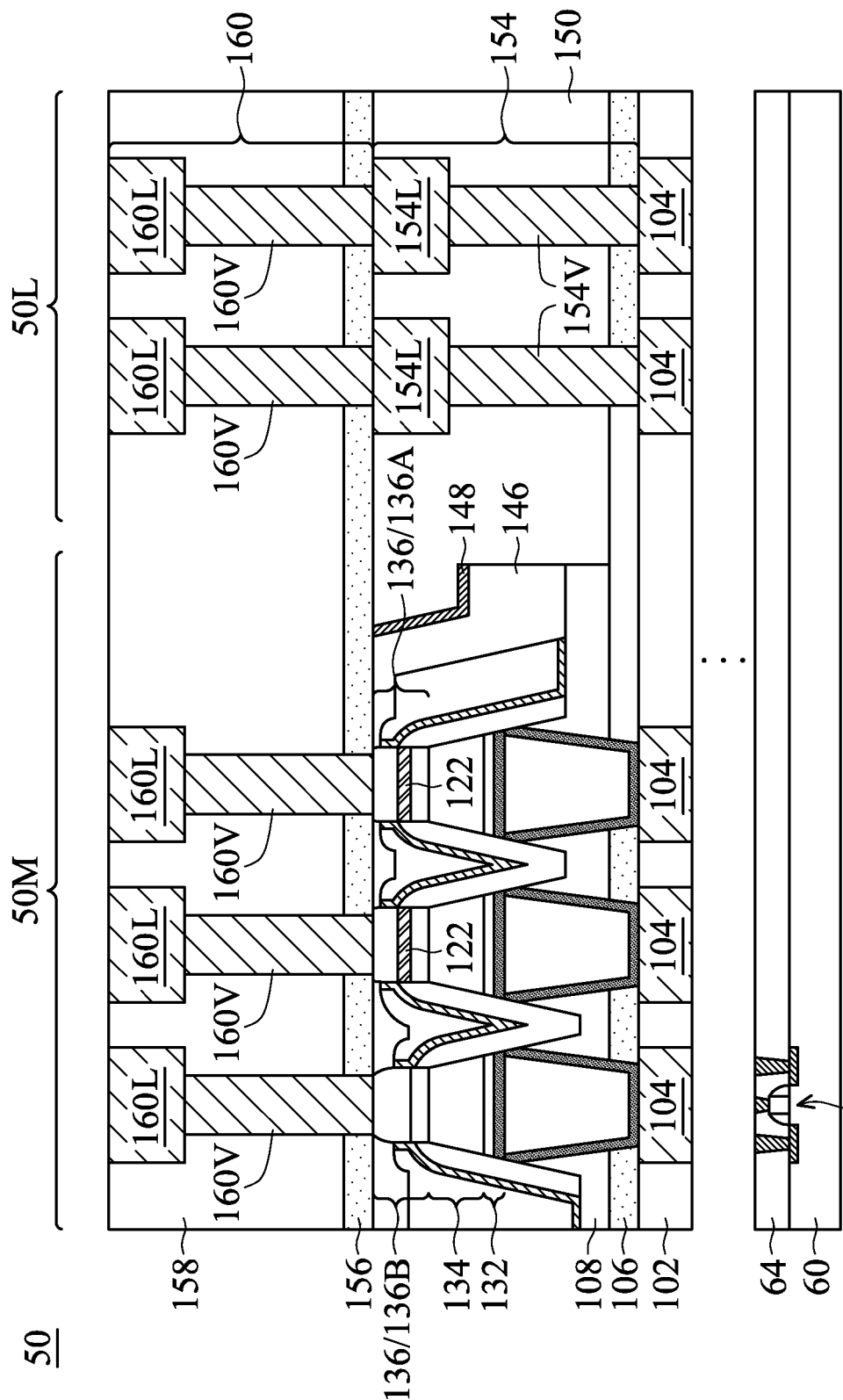
FIG. 16 is a cross-sectional view of a semiconductor device, in accordance with some other embodiments.

FIG. 16 is a cross-sectional view of a semiconductor device 50, in accordance with some other embodiments. In this embodiment, the protective mask 122 is patterned to extend further into the memory region 50M than the embodiment of FIG. 5. For example, the protective mask 122 can cover from 0.1% to 1% of the memory region 50M. Specifically, the protective mask 122 can cover all of the logic region 50L and from about 10 to about 30 row/column of MRAM cells 58 at the interface of the logic region 50L and memory region 50M. As such, multiple rows/columns of the MRAM cells 58 near the interface of the memory region 50M and logic region 50L have top electrodes 136A with portions of the protective mask 122. Lithographic shifting can occur during patterning of the protective mask 122. The amount of overlap between the protective mask 122 and the memory region 50M can change depending on the extent of the shifting during patterning.

Figure 17:
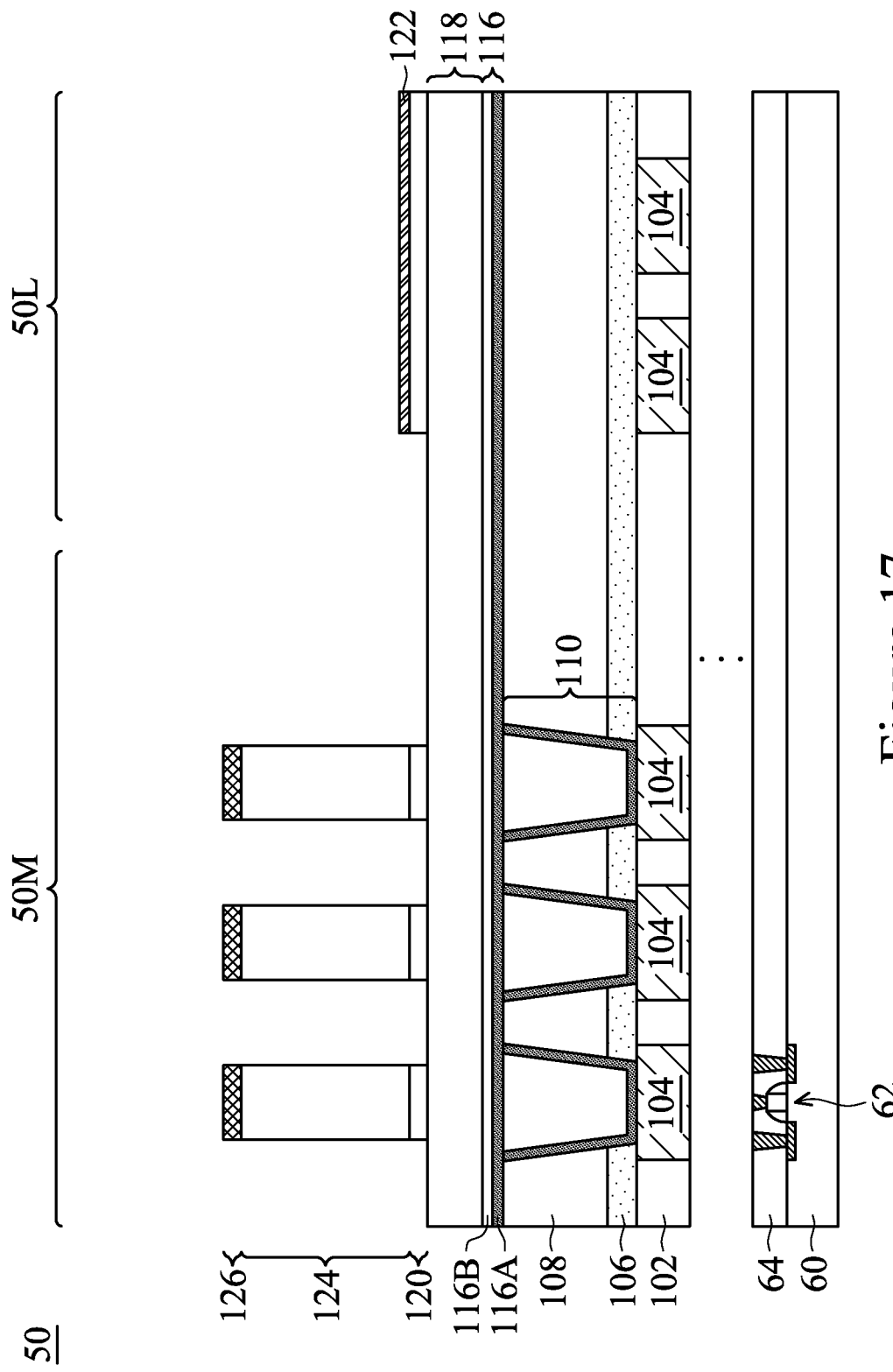
FIGS. 17 through 19 are various views of intermediate stages in the manufacturing of an interconnect structure for a semiconductor device, in accordance with some other embodiments.
Figure 18:
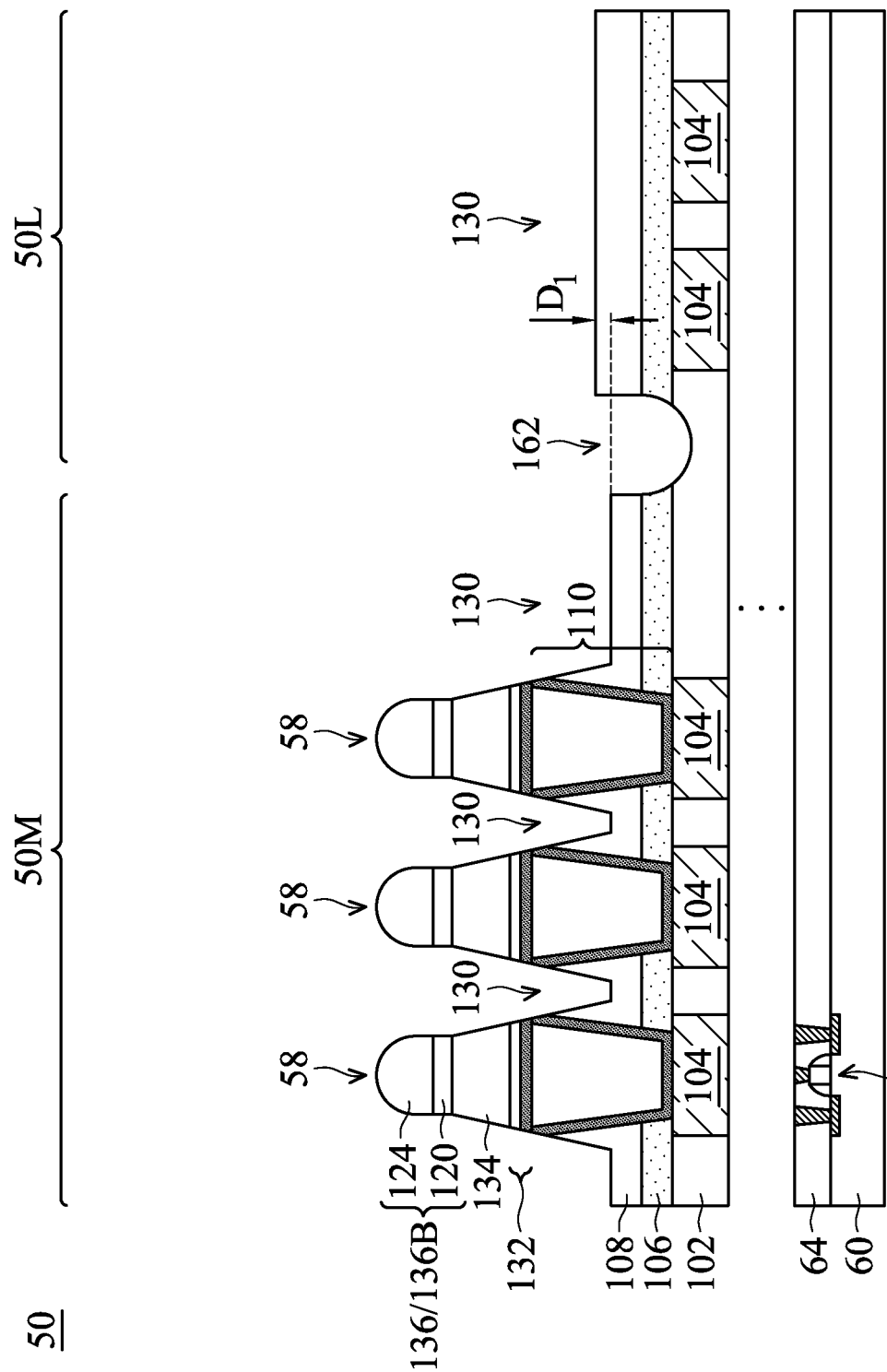
Figure 19:
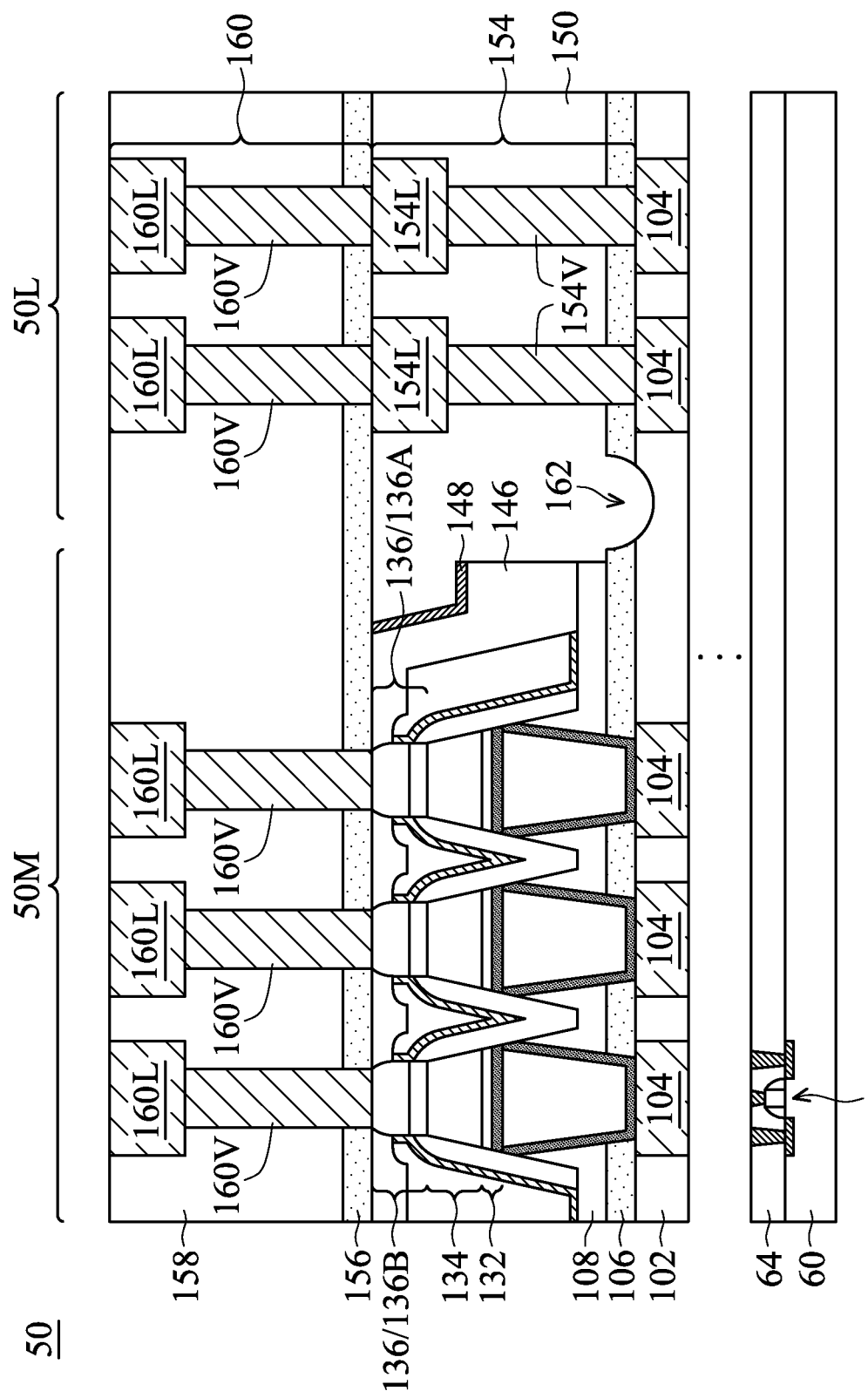

FIGS. 17 through 19 are cross-sectional views of intermediate stages in the manufacturing of a semiconductor device 50, in accordance with some others embodiments. Some of the processing steps of the embodiment of FIGS. 17 through 19 are similar to the processing steps of the embodiment of FIGS. 3 through 15, and so only differences in the processing steps are described. In this embodiment, the protective mask 122 is patterned to cover only a portion of the logic region 50L, and expose all of the memory region 50M.

FIG. 17 shows the semiconductor device 50 at a similar state of processing as FIG. 7, e.g., after patterning the first top electrode layer 120. The protective mask 122 is patterned such that portions of the logic region 50L near the memory region 50M are exposed. As a result, the protective mask 122 covers most but not all of the logic region 50L. For example, the protective mask 122 can cover from 90% to 99.9% of the logic region 50L. The exact amount of exposed logic region 50L may be controlled by formation of the etching mask used to pattern the protective mask 122 (see FIG. 5). Notably, the mask is selected such that the conductive features 104 in the logic region 50L are covered by the protective mask 122, and the exposed portions of the logic region 50L are free from the conductive features 104.

FIG. 18 shows the semiconductor device 50 at a similar state of processing as FIG. 8, e.g., after patterning the MRAM cells 58. After the patterning, the recesses 130 can still differ in depth by a distance Di. However, some of the over-etching during the IBE process discussed above can occur in the uncovered portions of the logic region 50L. The over-etching forms recesses 162 in the IMD layer 108, which can also extend into the etch stop layer 106 and the IMD layer 102. The recesses 162 can have rounded bottom surfaces. Although the recesses 162 are shown in a portion of the logic region 50L, it should be appreciated that the recesses 162 may be formed in all of the area between the memory cells 58 and the covered portions of the logic region 50L. Because the conductive features 104 in the logic region 50L remain protected by the protective mask 122, the recesses 162 do not expose or damage the conductive features 104. Advantageously, forming the protective mask 122 to expose a portion of the logic region 50L allows all of the protective mask 122 to be removed during the IBE process for patterning the MRAM cells 58.

FIG. 19 shows the semiconductor device 50 at a similar state of processing as FIG. 15. The IMD layer 150 fills the recesses 162, and so the bottommost surface of the IMD layer 150 can be below the bottommost surface of the etch stop layer 106. Advantageously, removing all of the protective mask 122 during formation of the MRAM cells 58 allows all of the resulting MRAM cells 58 to have top electrodes 136B that are free of remaining portions of the protective mask 122. By avoiding the formation of top electrodes 136A (see FIG. 8), all of the resulting MRAM cells 58 can have similar high resistance ($R_{ap}$) and low resistance ($R_p$) values.

Figure 20:
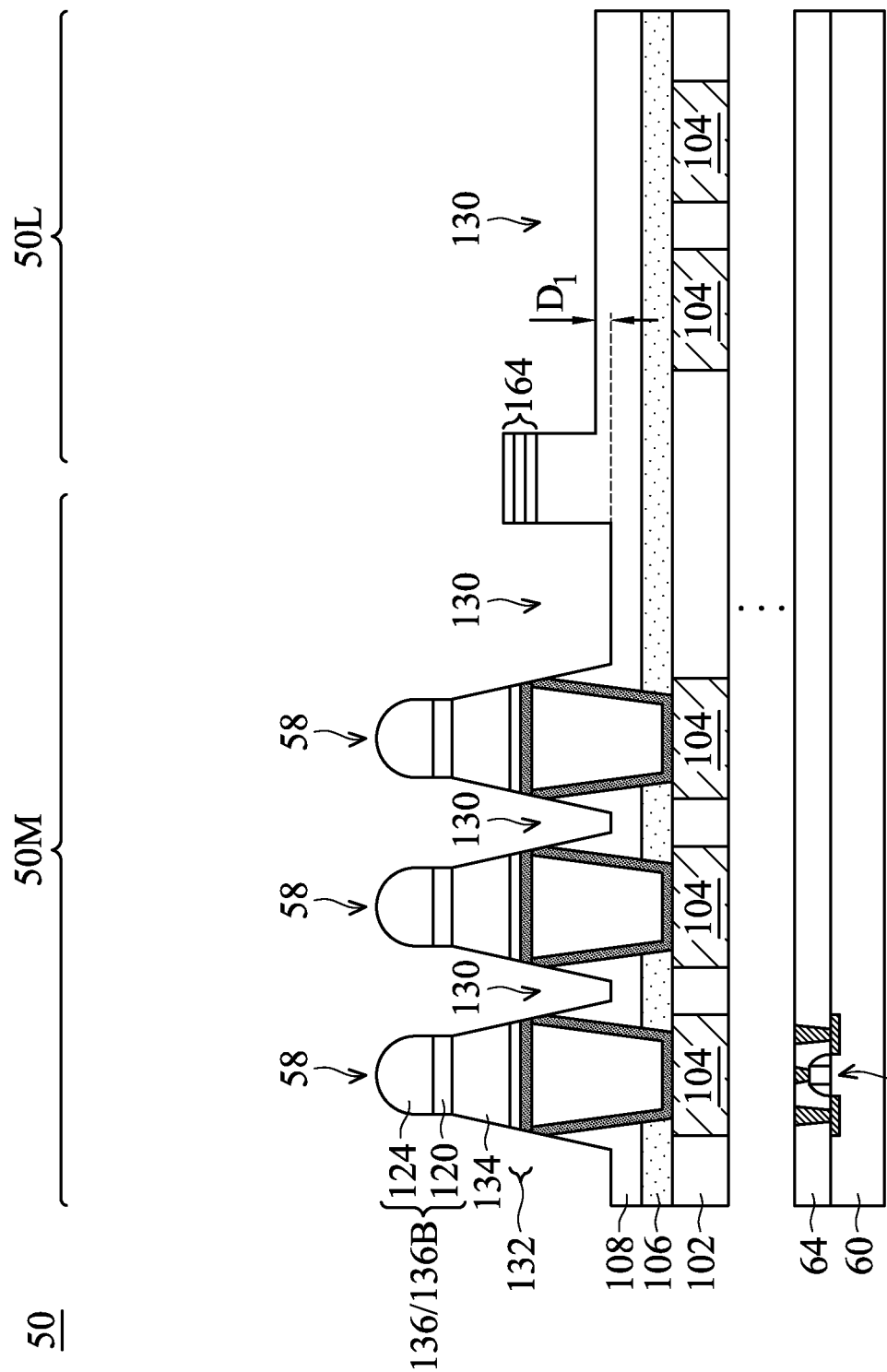
FIGS. 20 through 21 are various views of intermediate stages in the manufacturing of an interconnect structure for a semiconductor device, in accordance with some other embodiments.
Figure 21:
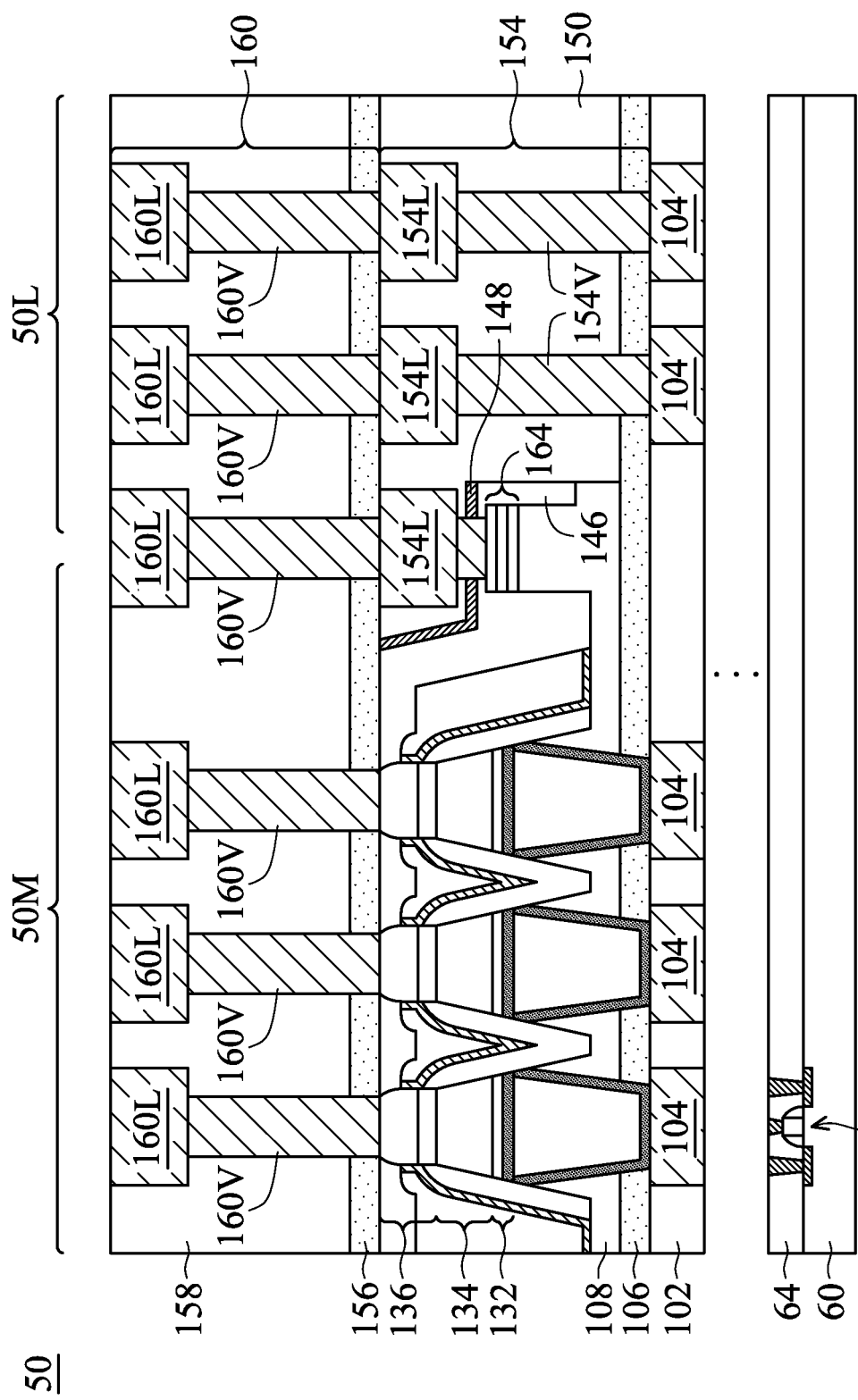

FIGS. 20 through 21 are cross-sectional views of intermediate stages in the manufacturing of a semiconductor device 50, in accordance with some others embodiments. Some of the processing steps of the embodiment of FIGS. 20 through 21 are similar to the processing steps of the embodiment of FIGS. 3 through 15, and so only differences in the processing steps are described. In this embodiment, the protective mask 122 is patterned to cover a portion of the logic region 50L, and expose all of the memory region 50M. Further, resistors 164 are formed in the logic region 50L. Although only one resistor 164 is illustrated, it should be appreciated that multiple resistors 164 can be formed.

FIG. 20 shows the semiconductor device 50 at a similar state of processing as FIG. 8, e.g., after patterning the MRAM cells 58. Some portions of the bottom electrode layer(s) 116 and MTJ film stack 118 in the logic region 50L are masked during the process for patterning the MRAM cells 58 (see FIG. 8). Some of the masked portions of the bottom electrode layer(s) 116 and MTJ film stack 118 thus remain in the logic region 50L, and form what will be resistors 164. As an example to form the resistors 164, the photosensitive mask 128 (see FIG. 6) can be formed with a pattern in the logic region 50L, and used to pattern the resistors 164 in subsequent patterning processes, such as the patterning process described with respect to FIGS. 7 and 8. After patterning, the recesses 130 can still differ in depth by a distance Di. To help protect the bottom electrode layer(s) 116 and ensure formation of the resistors 164, the thickness of the protective mask 122 may be larger in this embodiment, such as in the range of about 200 Å to about 500 Å.

FIG. 21 shows the semiconductor device 50 at a similar state of processing as FIG. 15. Some of the conductive features 154 are physically and electrically coupled to the resistors 164, such as to the topmost surfaces of the resistors 164. Some portions of the topmost surfaces of the resistors 164 can also be contacted by the IMD layer 146. Advantageously, forming the resistors 164 in the logic region 50L from portions of the MTJ film stack 118 allows resistors 164 of a high impedance to be formed for the logic devices. For example, the resistors 164 can have an impedance in the range of about 0.5 kΩ to about 5 kΩ.

Figure 22:
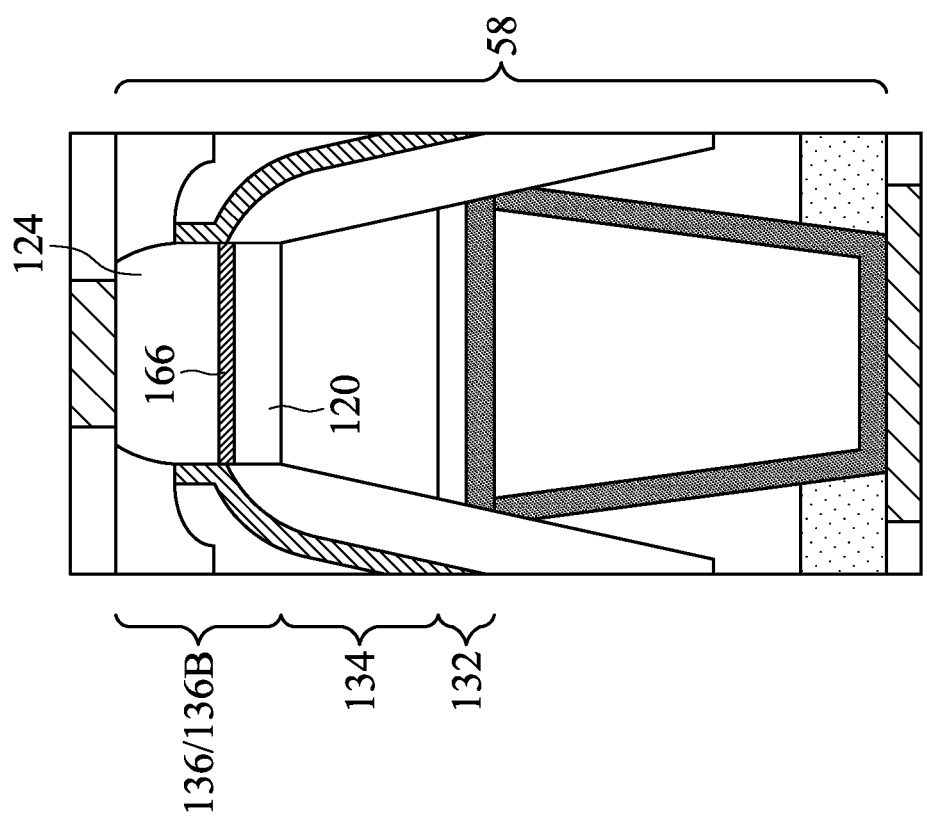
FIG. 22 is a detailed view of a MRAM cell, in accordance with some embodiments.

FIG. 22 is a detailed view of a MRAM cell 58, in accordance with some other embodiments. During the formation of the MRAM cell 58, an interfacial oxide layer 166 can be formed in the top electrodes 136B, between the first top electrode layer 120 and the second top electrode layer 124. The interfacial oxide layer 166 can be formed by oxidizing the first top electrode layer 120, before the second top electrode layer 124 is formed. For example, the first top electrode layer 120 and second top electrode layer 124 can be formed in different processes, and a vacuum in the processing chamber can be broken between the processes such that the first top electrode layer 120 is exposed to an oxygen-containing environment. The thickness of the interfacial oxide layer 166 can be controlled by varying the duration of exposure to the environment. In some embodiments, the thickness can optionally be further controlled by etching the interfacial oxide layer 166. For example, a wet etch with dHF can be performed before formation of the second top electrode layer 124 (see FIG. 6), to reduce the interfacial oxide layer 166 to a desired thickness. The amount of remaining interfacial oxide layer 166 can affect the high resistance ($R_{ap}$) and low resistance ($R_p$) values of the MRAM cell 58, with a thicker interfacial oxide layer 166 resulting in higher resistance values. In other words, the high resistance ($R_{ap}$) and low resistance ($R_p$) values of the MRAM cell 58 can be adjusted by forming the interfacial oxide layer 166 to a desired thickness. As such, in some embodiments, some of the top electrodes 136 (e.g., the top electrodes 136A) can have a first dielectric layer (e.g., the protective mask 122) of a first thickness, and some of the top electrodes 136 (e.g., the top electrodes 136B) can have a second dielectric layer (e.g., the interfacial oxide layer 166) of a lesser second thickness.

Figure 23:
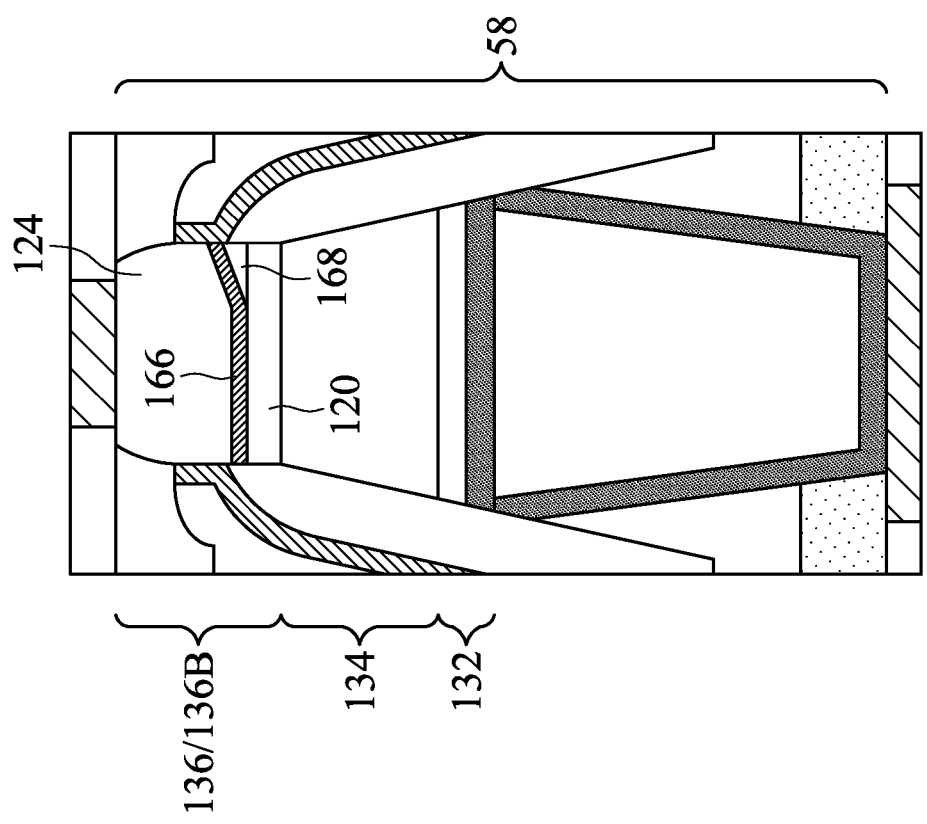
FIG. 23 is a detailed view of a MRAM cell, in accordance with some other embodiments.

FIG. 23 is a detailed view of a MRAM cell 58, in accordance with some other embodiments. During the formation of the MRAM cell 58, an insulating feature 168 can be formed in the top electrodes 136B, between the first top electrode layer 120 and the second top electrode layer 124. The insulating feature 168 can be formed by patterning the protective mask 122 to partially cover some MRAM cells 58 so that residue from the protective mask 122 remains in some top electrodes 136B. The interfacial oxide layer 166 can also be formed between the second top electrode layer 124 and the insulating feature 168. The interfacial oxide layer 166 thus can have an uneven (e.g., non-flat) interface with underlying features. As noted above, a cleaning process can be performed to try and control the thickness of the interfacial oxide layer 166. The amount of remaining interfacial oxide layer 166 and insulating feature 168 can affect the high resistance ($R_{ap}$) and low resistance ($R_p$) values of the MRAM cell 58, with a thicker interfacial oxide layer 166 and larger insulating feature 168 resulting in higher resistance values.

It should be appreciated that, due to variations in processing, a semiconductor device 50 can have many of the features discussed herein. For example, a semiconductor device 50 can have MRAM cells 58 with flat interfacial oxide layers 166, MRAM cells 58 with uneven interfacial oxide layers 166, and MRAM cells 58 without interfacial oxide layers 166. Further, the recesses 162 (see FIG. 18) can be formed in some areas of the logic region 50L, but not in other areas of the logic region 50L. Finally, the resistors 164 (see FIG. 21) can be formed in some areas of the logic region 50L, but not in other areas of the logic region 50L. For example, both recesses 162 can be formed in some areas of the logic region 50L and resistors 164 can be formed in other areas of the logic region 50L.

Embodiments may achieve advantages. Forming the protective mask 122 at least partially over the logic region 50L (see FIG. 5) helps protect the logic region 50L from overetching damage during the IBE process for patterning the MTJ stacks 134 (see FIG. 8). Specifically, the protective mask 122 slows the IBE process in the logic region 50L, preventing the IBE process from damaging underlying conductive features 104. The reliability of the resulting MRAM cells 58 may thus be improved, and the manufacturing yield of the semiconductor device 50 may also be improved.

In an embodiment, a method includes: forming a first inter-metal dielectric (IMD) layer over a semiconductor substrate; forming a bottom electrode layer over the first IMD layer; forming a magnetic tunnel junction (MTJ) film stack over the bottom electrode layer; forming a first top electrode layer over the MTJ film stack; forming a protective mask covering a first region of the first top electrode layer, a second region of the first top electrode layer being uncovered by the protective mask; forming a second top electrode layer over the protective mask and the first top electrode layer; and patterning the second top electrode layer, the first top electrode layer, the MTJ film stack, the bottom electrode layer, and the first IMD layer with an ion beam etching (IBE) process to form a MRAM cell, where the protective mask is etched during the IBE process, the IBE process etching the protective mask at a first etch rate, the IBE process etching the first top electrode layer at a second etch rate, the first etch rate being less than the second etch rate.

In some embodiments of the method, forming the protective mask includes: depositing a mask layer on the first region and the second region of the first top electrode layer with a chemical vapor deposition process using tetraethyl orthosilicate (TEOS) as a precursor; and patterning the mask layer to remove portions of the mask layer over the second region of the first top electrode layer. In some embodiments of the method, the MRAM cell is formed from the first region of the first top electrode layer, and the MRAM cell includes: a bottom electrode including portions of the bottom electrode layer remaining after the IBE process; a MTJ stack including portions of the MTJ film stack remaining after the IBE process; and a top electrode including portions of the first top electrode layer and the second top electrode layer remaining after the IBE process, where the IBE process removes all of the protective mask. In some embodiments of the method, the MRAM cell is formed from the second region of the first top electrode layer, and the MRAM cell includes: a bottom electrode including portions of the bottom electrode layer remaining after the IBE process; a MTJ stack including portions of the MTJ film stack remaining after the IBE process; and a top electrode including portions of the first top electrode layer, the second top electrode layer, and the protective mask remaining after the IBE process. In some embodiments, the method further includes: patterning a first recess and a second recess in the first IMD layer with the IBE process, the first recess being in portions of the first IMD layer that were beneath the first region of the first top electrode layer, the second recess being in portions of the first IMD layer that were beneath the second region of the first top electrode layer, the second recess being deeper than the first recess. In some embodiments, the method further includes: patterning a third recess in the first IMD layer with the IBE process, the third recess being disposed beneath the second region of the first top electrode layer, the third recess being deeper than the first recess and the second recess. In some embodiments, the method further includes: patterning the MTJ film stack, the bottom electrode layer, and the first IMD layer with the IBE process to form a resistor; forming a second IMD layer over the resistor; and forming a conductive feature extending through the second IMD layer to contact the resistor. In some embodiments of the method, a ratio of the first etch rate to the second etch rate is in a range of 1:1 to 1:2.5. In some embodiments of the method, the IBE process is performed for a duration in a range of 100 seconds to 600 seconds. In some embodiments of the method, the first region occupies from 95% to 99% of the area of the first top electrode layer.

In an embodiment, a device includes: a semiconductor substrate including active devices; a first inter-metal dielectric (IMD) layer over the semiconductor substrate; a first conductive feature extending through the first IMD layer, the first conductive feature being electrically connected to the active devices; a first bottom electrode over the first conductive feature; a first magnetic tunnel junction (MTJ) stack over the first bottom electrode; a first top electrode including: a first conductive layer over the first MTJ stack; a dielectric layer over the first conductive layer; and a second conductive layer over the dielectric layer; a second IMD layer over the first top electrode; and a second conductive feature extending through the second IMD layer, the second conductive feature contacting the first top electrode.

In some embodiments, the device further includes: a third conductive feature extending through the first IMD layer; a second bottom electrode over the third conductive feature; a second MTJ stack over the second bottom electrode; a second top electrode including: a third conductive layer over the second MTJ stack; and a fourth conductive layer over the third conductive layer; and a fourth conductive feature extending through the second IMD layer, the fourth conductive feature contacting the second top electrode, where the second IMD layer is over the second top electrode, and where a combined thickness of the third conductive layer and the fourth conductive layer is equal to a combined thickness of the first conductive layer, the dielectric layer, and the second conductive layer. In some embodiments, the device further includes: a spacer disposed on sidewalls of the first conductive layer, the second conductive layer, the third conductive layer, the fourth conductive layer, the dielectric layer, the first MTJ stack, the second MTJ stack, the first bottom electrode, and the second bottom electrode. In some embodiments, the device further includes an interfacial oxide layer at an interface of the third conductive layer and the fourth conductive layer, the interfacial oxide layer being flat. In some embodiments, the device further includes an interfacial oxide layer at an interface of the third conductive layer and the fourth conductive layer, the interfacial oxide layer being uneven. In some embodiments, the device further includes: a third IMD layer over the semiconductor substrate, the third IMD layer being adjacent the first IMD layer; a third conductive feature extending through the third IMD layer, the third conductive feature being electrically connected to the active devices; and a fourth conductive feature extending through the second IMD layer, the fourth conductive feature contacting the third conductive feature.

In an embodiment, a device including: a semiconductor substrate including active devices; an inter-layer dielectric (ILD) layer over the semiconductor substrate; a first inter-metal dielectric (IMD) layer over the ILD layer; a first conductive feature extending through the first IMD layer, the first conductive feature being electrically connected to the active devices; a first bottom electrode over the first conductive feature; a first magnetic tunnel junction (MTJ) stack over the first bottom electrode; a first top electrode including: a first conductive layer over the first MTJ stack; and a second conductive layer over the first conductive layer; a spacer disposed on sidewalls of the first conductive layer, the second conductive layer, the first MTJ stack, and the first bottom electrode; a second IMD layer having a first portion and a second portion, the first portion being over the ILD layer, the second portion extending at least partially into the ILD layer; and a second conductive feature extending through the first portion of the second IMD layer, the second conductive feature being electrically connected to the active devices.

In some embodiments of the device, the second portion of the second IMD layer has a rounded bottom surface. In some embodiments, the device further includes: a resistor on a portion of the first IMD layer, the second IMD layer contacting a top surface of the resistor; and a third conductive feature extending through the first portion of the second IMD layer, the third conductive feature contacting the top surface of the resistor. In some embodiments of the device, the first top electrode further includes: a dielectric feature disposed between a portion of the first conductive layer and a portion of the second conductive layer; and an interfacial oxide layer at an interface of the first conductive layer and the second conductive layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a first inter-metal dielectric over a semiconductor substrate, the semiconductor substrate comprising active devices;
   a first conductive feature extending through the first inter-metal dielectric, the first conductive feature electrically connected to the active devices;
   a first bottom electrode over the first conductive feature;
   a first magnetic tunnel junction stack over the first bottom electrode;
   a first top electrode comprising:
      a first conductive layer over the first magnetic tunnel junction stack;
      a dielectric layer over the first conductive layer; and
      a second conductive layer over the dielectric layer;
   a second inter-metal dielectric over the first top electrode; and
   a second conductive feature extending through the second inter-metal dielectric, the second conductive feature contacting the first top electrode.

2. The device of claim 1 further comprising:
   a third conductive feature extending through the first inter-metal dielectric;
   a second bottom electrode over the third conductive feature;
   a second magnetic tunnel junction stack over the second bottom electrode;
   a second top electrode comprising:
      a third conductive layer over the second magnetic tunnel junction stack; and
      a fourth conductive layer over the third conductive layer; and
   a fourth conductive feature extending through the second inter-metal dielectric, the fourth conductive feature contacting the second top electrode,
   wherein the second inter-metal dielectric is over the second top electrode, and
   wherein a combined thickness of the third conductive layer and the fourth conductive layer is equal to a combined thickness of the first conductive layer, the dielectric layer, and the second conductive layer.

3. The device of claim 2 further comprising:
   a spacer disposed on sidewalls of the first conductive layer, the second conductive layer, the third conductive layer, the fourth conductive layer, the dielectric layer, the first magnetic tunnel junction stack, the second magnetic tunnel junction stack, the first bottom electrode, and the second bottom electrode.

4. The device of claim 2 further comprising an interfacial oxide layer at an interface of the third conductive layer and the fourth conductive layer, the interfacial oxide layer being flat.

5. The device of claim 2 further comprising an interfacial oxide layer at an interface of the third conductive layer and the fourth conductive layer, the interfacial oxide layer being uneven.

6. The device of claim 1 further comprising:
   a third inter-metal dielectric over the semiconductor substrate, the third inter-metal dielectric adjacent the first inter-metal dielectric;
   a third conductive feature extending through the third inter-metal dielectric, the third conductive feature electrically connected to the active devices; and a fourth conductive feature extending through the second inter-metal dielectric, the fourth conductive feature contacting the third conductive feature.

7. A device comprising:
a first memory cell comprising:
a first bottom electrode;
a first magnetic tunnel junction stack on the first bottom electrode; and
a first top electrode on the first magnetic tunnel junction stack, the first top electrode comprising first conductive layers and a first dielectric layer between the first conductive layers, the first dielectric layer having a first thickness;
a second memory cell comprising:
a second bottom electrode;
a second magnetic tunnel junction stack on the second bottom electrode; and
a second top electrode on the second magnetic tunnel junction stack, the second top electrode comprising second conductive layers and a second dielectric layer between the second conductive layers, the second dielectric layer having a second thickness, the second thickness less than the first thickness.

8. The device of claim 7 further comprising:
an inter-layer dielectric adjacent the first memory cell and the second memory cell; and
a conductive feature extending through the inter-layer dielectric, a top surface of the conductive feature planar with a top surface of the first top electrode and a top surface of the second top electrode.

9. The device of claim 7 further comprising:
an inter-layer dielectric above the first memory cell and the second memory cell;
a first conductive feature extending through the inter-layer dielectric, the first conductive feature contacting the first top electrode; and
a second conductive feature extending through the inter-layer dielectric, the second conductive feature contacting the second top electrode.

10. The device of claim 7, wherein the first dielectric layer has a flat interface with an underlying first conductive layer, and the second dielectric layer has a flat interface with an underlying second conductive layer.

11. The device of claim 7, wherein the first dielectric layer has a flat interface with an underlying first conductive layer, and the second dielectric layer has an uneven interface with an underlying second conductive layer.

12. The device of claim 7 further comprising:
an inter-metal dielectric above a semiconductor substrate;
a first conductive feature extending through the inter-metal dielectric, the first bottom electrode disposed on the first conductive feature; and
a second conductive feature extending through the inter-metal dielectric, the second bottom electrode disposed on the second conductive feature.

13. The device of claim 12 further comprising:
a first spacer on a first top surface of the inter-metal dielectric and on a first sidewall of the first memory cell; and
a second spacer on a second top surface of the inter-metal dielectric and on a second sidewall of the second memory cell, the second top surface disposed further from the semiconductor substrate than the first top surface.

14. The device of claim 12, wherein the inter-metal dielectric comprises a same material as the first dielectric layer.

15. The device of claim 13, wherein a thickness of the first top electrode is equal to a thickness of the second top electrode.

16. The device of claim 13 further comprising:
a third memory cell between the first memory cell and the second memory cell, the third memory cell comprising:
a third bottom electrode;
a third magnetic tunnel junction stack on the third bottom electrode; and
a third top electrode on the third magnetic tunnel junction stack, the third top electrode comprising third conductive layers and a third dielectric layer between the third conductive layers, the third dielectric layer having the first thickness.

17. A device comprising:
an inter-layer dielectric over a semiconductor substrate, the semiconductor substrate comprising active devices;
a first inter-metal dielectric over the inter-layer dielectric;
a first conductive feature extending through the first inter-metal dielectric, the first conductive feature electrically connected to the active devices;
a first bottom electrode over the first conductive feature;
a first magnetic tunnel junction stack over the first bottom electrode;
a first top electrode comprising:
a first conductive layer over the first magnetic tunnel junction stack; and
a second conductive layer over the first conductive layer;
a spacer disposed on sidewalls of the first conductive layer, the second conductive layer, the first magnetic tunnel junction stack, and the first bottom electrode;
a second inter-metal dielectric having a first portion and a second portion, the first portion disposed over the inter-layer dielectric, the second portion extending at least partially into the inter-layer dielectric; and
a second conductive feature extending through the first portion of the second inter-metal dielectric, the second conductive feature electrically connected to the active devices.

18. The device of claim 17, wherein the second portion of the second inter-metal dielectric has a rounded bottom surface.

19. The device of claim 17 further comprising:
a resistor on a portion of the first inter-metal dielectric; and
a third conductive feature extending through the first portion of the second inter-metal dielectric, the third conductive feature contacting a top surface of the resistor.

20. The device of claim 17, wherein the first top electrode further comprises:
a dielectric feature disposed between a portion of the first conductive layer and a portion of the second conductive layer; and
an interfacial oxide layer at an interface of the first conductive layer and the second conductive layer.

* * * * *